(12) United States Patent
Kim et al.

(10) Patent No.: US 12,548,478 B2
(45) Date of Patent: Feb. 10, 2026

(54) DISPLAY DEVICE

(71) Applicant: Samsung Display Co., LTD., Yongin-si (KR)

(72) Inventors: Hyung June Kim, Yongin-si (KR); Sang Seop Kum, Yongin-si (KR); Won Tae Kim, Yongin-si (KR); Seung Kyu Lee, Yongin-si (KR); Eun Je Jang, Yongin-si (KR); Jang Bog Ju, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 631 days.

(21) Appl. No.: 17/880,143

(22) Filed: Aug. 3, 2022

(65) Prior Publication Data

US 2023/0044290 A1 Feb. 9, 2023

(30) Foreign Application Priority Data

Aug. 4, 2021 (KR) .......................... 10-2021-0102695

(51) Int. Cl.
  *G09F 9/302* (2006.01)
  *H10H 20/851* (2025.01)
  *H10H 20/857* (2025.01)

(52) U.S. Cl.
  CPC ....... *G09F 9/3026* (2013.01); *H10H 20/8514* (2025.01); *H10H 20/857* (2025.01)

(58) Field of Classification Search
  CPC ...... H10K 59/12; H10K 59/10; H10K 50/844; H10K 59/8731; H10K 50/8445; H10K 59/124; H10K 50/84
  See application file for complete search history.

(56) References Cited

U.S. PATENT DOCUMENTS 9,146,400 B1   9/2015   Lee et al.
9,461,266 B2  10/2016   Lee
(Continued)

FOREIGN PATENT DOCUMENTS

KR        10-0960129    5/2010
KR     10-2014-0080246  6/2014
(Continued)

OTHER PUBLICATIONS

Kim Jong Sung and Choi Hyun Min, Organic Light-Emitting Diode Display Device and Method for Manufacturing the Same, 2019 (Year: 2019).*

*Primary Examiner* — Kretelia Graham
*Assistant Examiner* — Hamna Fathima Iqbal
(74) *Attorney, Agent, or Firm* — Womble Bond Dickinson (US) LLP

(57) ABSTRACT

A display device including a display area and a non-display area, an inorganic insulating layer disposed on a substrate, the inorganic insulating layer disposed in the display area and the non-display area, pixels disposed on the substrate and overlapping the inorganic insulating layer in a plan view, the pixels disposed in the display area, and an organic insulating layer disposed on the substrate and overlapping the inorganic insulating layer and the pixels in a plan view, the organic insulating layer disposed at least in the display area. The non-display area includes an organic layer-free area including at least one of a corner and an outer edge area of the display device. The organic insulating layer is disposed on a portion of the substrate so as to be disposed in an area except for the organic layer-free area.

16 Claims, 18 Drawing Sheets

(56) References Cited

U.S. PATENT DOCUMENTS

| | | |
|---|---|---|
| 9,709,838 B2 | 7/2017 | Jung et al. |
| 10,181,507 B2 | 1/2019 | Bower et al. |
| 10,319,944 B2 | 6/2019 | Lee et al. |
| 11,335,888 B2 | 5/2022 | Lee et al. |
| 2015/0255739 A1* | 9/2015 | Kim ............... H10K 59/124 428/192 |
| 2017/0005293 A1* | 1/2017 | Kim ............... H10K 50/8445 |
| 2017/0244061 A1* | 8/2017 | Jin ............... H10K 59/8731 |
| 2020/0381484 A1* | 12/2020 | Choe ............... H10K 50/858 |

FOREIGN PATENT DOCUMENTS

| | | |
|---|---|---|
| KR | 10-2015-0025513 | 3/2015 |
| KR | 10-2015-0077160 | 7/2015 |
| KR | 10-2016-0027489 | 3/2016 |
| KR | 10-2017-0003297 | 1/2017 |
| KR | 102037051 B1 * | 10/2019 |
| KR | 10-2133914 | 7/2020 |
| KR | 10-2020-0138528 | 12/2020 |
| KR | 10-2021-0019256 | 2/2021 |

* cited by examiner

DISPLAY DEVICE

CROSS-REFERENCE TO RELATED APPLICATION(S)

This application claims priority to and benefits of Korean Patent Application No. 10-2021-0102695 under 35 U.S.C. § 119, filed on Aug. 4, 2021 in the Korean Intellectual Property Office, the entire contents of which are herein incorporated by reference.

BACKGROUND

1. Technical Field

An embodiment of the disclosure relates to a display device.

2. Description of the Related Art

Recently, interest in information display is increasing. Accordingly, research and development of display devices has been continuously conducted.

SUMMARY

A technical aspect of the disclosure is to provide a display device capable of reducing damage due to a cutting process and reducing a non-display area.

Aspects of the disclosure are not limited to the above-described aspect, and other technical aspects that are not described will be clearly understood by those skilled in the art from the following description.

A display device according to an embodiment of the disclosure may include a display area and a non-display area, an inorganic insulating layer disposed on a substrate, the inorganic insulating layer disposed in the display area and the non-display area, pixels disposed on the substrate and overlapping the inorganic insulating layer in a plan view, the pixels disposed in the display area, and an organic insulating layer disposed on the substrate and overlapping the inorganic insulating layer and the pixels in a plan view, the organic insulating layer disposed at least in the display area. The non-display area may include an organic layer-free area including at least one of a corner and an outer edge area of the display device. The organic insulating layer may be disposed on a portion of the substrate so as to be disposed in an area except for the organic layer-free area.

In an embodiment, the organic layer-free area may correspond to the non-display area in a plan view, and the organic insulating layer may be disposed only in the display area.

In an embodiment, the display device may further include edge areas disposed in different portions of the non-display area, and corner areas where the edge areas meet, wherein the organic layer-free area may include the corner areas.

In an embodiment, the edge areas may include a first edge area including a pad area, and the organic layer-free area may further include the first edge area.

In an embodiment, the organic insulating layer may be further disposed in a portion of remaining edge areas of the edge areas except for the first edge area.

In an embodiment, the organic insulating layer may be disposed in a center area of each of the remaining edge areas except for ends corresponding to the corner areas in each of the remaining edge areas.

In an embodiment, the organic insulating layer may have a width corresponding to a width of each of the remaining edge areas in the center area of each of the remaining edge areas.

In an embodiment, the organic insulating layer may have a width less than a width of each of the remaining edge areas in the center area of each of the remaining edge areas.

In an embodiment, the non-display area may include a first non-display area adjacent to the display area and surrounding the display area, and a second non-display area adjacent to the first non-display area and surrounding the first non-display area.

In an embodiment, the organic insulating layer may be disposed in the first non-display area in center area of each of the remaining edge areas, and the second non-display area may include the outer edge area of the display device and may correspond to the organic layer-free area in a plan view.

In an embodiment, the non-display area may further include a third non-display area surrounding the second non-display area and including the outer edge area of the display device.

In an embodiment, the organic insulating layer may be disposed in the first non-display area and the third non-display area in the center area of each of the remaining edge areas, and the second non-display area may correspond to the organic layer-free area.

In an embodiment, the organic insulating layer disposed in the third non-display area may be separated from the organic insulating layer disposed in the display area and the first non-display area.

In an embodiment, each of the pixels may include a light emitting unit including at least one light emitting element.

In an embodiment, the organic insulating layer may include a first organic insulating layer between the light emitting unit of each of the pixels and the inorganic insulating layer, the first organic insulating layer being disposed entirely in the display area, and a second organic insulating layer disposed on the light emitting unit of each of the pixels, the second organic insulating layer being disposed entirely in the display area.

In an embodiment, the display device may further include a light conversion layer between the light emitting unit of each of the pixels and the second organic insulating layer, the light conversion layer including at least one of wavelength conversion particles and light scattering particles that are disposed in an emission area of each of the pixels, and a color filter layer including a color filter disposed on the second organic insulating layer and overlapping the light emitting unit of each of the pixels in a plan view.

In an embodiment, the organic insulating layer may further include a third organic insulating layer disposed on the color filter layer, the third organic insulting layer being disposed entirely in the display area.

In an embodiment, each of the pixels may further include a pixel circuit including a transistor electrically connected to the light emitting unit.

In an embodiment, the display device may further include a circuit layer disposed with pixel circuits of the pixels, wherein the inorganic insulating layer may include a plurality of inorganic insulating layers disposed on the circuit layer.

In an embodiment, the display area may be disposed in a center area of the display device, and the non-display area may be disposed in an edge area of the display device and may have a width of about 50 micrometers or less.

Details of other embodiments are included in the detailed description and drawings.

In accordance with a display device according to an embodiment of the disclosure, at least a portion of the non-display area positioned in the edge area of the substrate may be set as the organic layer-free area. For example, at least a portion of the non-display area including at least one of the corner area and the outermost edge area of the display device belonging to a laser heat affected zone (HAZ) may be set as the organic layer-free area.

Accordingly, damage to the substrate may be reduced by separating the display device from a manufacturing substrate by a laser cutting process using a laser. Damage to the organic insulating layer due to the laser may be prevented or reduced.

According to the embodiments of the disclosure, damage to the display device due to a cutting process or the like for separating the display device from the manufacturing substrate may be prevented or reduced. Accordingly, a cutting tolerance may be reduced or minimized, and the non-display area of the display device may be reduced or minimized.

Effects according to the embodiments are not limited by the contents illustrated above, and more various effects are included in the specification.

BRIEF DESCRIPTION OF THE DRAWINGS

The above and other features of the disclosure will become more apparent by describing in further detail embodiments thereof with reference to the accompanying drawings, in which.

DETAILED DESCRIPTION OF THE EMBODIMENTS

Figure 1:
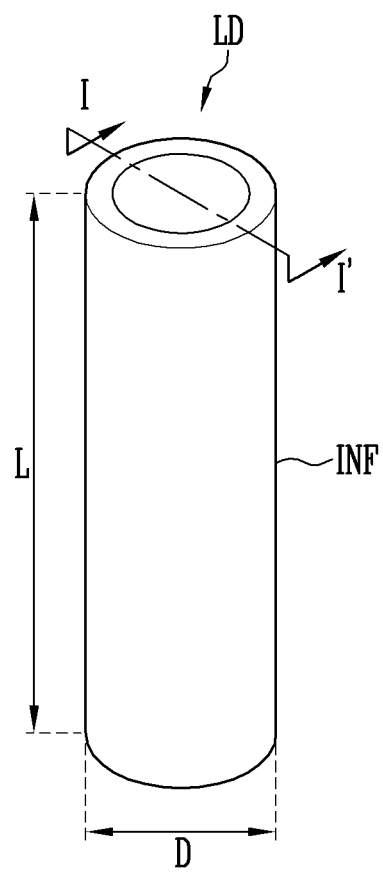
FIG. 1 is a schematic perspective view illustrating a light emitting element according to an embodiment of the disclosure.

The disclosure may be modified in various ways and may have various forms, and only certain specific embodiments will be illustrated in the drawings and described in detail herein. In the following description, the singular forms also include the plural forms unless the context clearly includes otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or." In the specification and the claims, the phrase "at least one of" is intended to include the meaning of "at least one selected from the group of" for the purpose of its meaning and interpretation. For example, "at least one of A and B" may be understood to mean "A, B, or A and B."

The disclosure is not limited to the embodiments disclosed below, and may be modified and implemented in various forms. Each of the embodiments disclosed below may be implemented alone or in combination with at least one of the other embodiments.

In the drawings, some components which are not directly related to a characteristic of the disclosure may be omitted to more clearly present the disclosure. Throughout the drawings, the same or similar components will be given by the same reference numerals and symbols as much as possible even though they are shown in different drawings. Repetitive descriptions will be omitted.

In describing embodiments of the disclosure, the term "connection (or coupling)" may mean a physical and/or electrical connection (or coupling) inclusively. In addition, the term "connection (or coupling)" may mean a direct connection (or coupling) and an indirect connection (or coupling) inclusively, and may mean an integral connection (or coupling) and a non-integral connection (or coupling) inclusively. Similarly, when an element is referred to as being "in contact" or "contacted" or the like to another element, the element may be in "electrical contact" or in "physical contact" with another element; or in "indirect contact" or in "direct contact" with another element.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
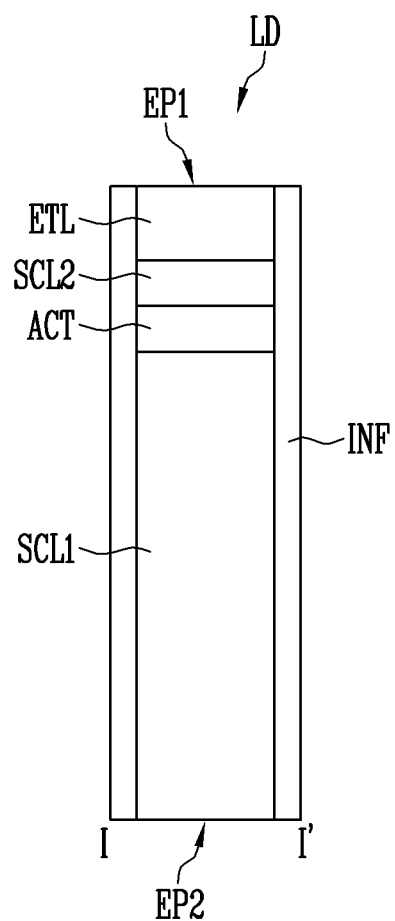
FIG. 2 is a schematic cross-sectional view illustrating a light emitting element according to an embodiment of the disclosure.

FIG. 1 is a schematic perspective view illustrating a light emitting element LD according to an embodiment of the disclosure. FIG. 2 is a schematic cross-sectional view illustrating a light emitting element LD according to an embodiment of the disclosure. For example, FIG. 1 illustrates an example of the light emitting element LD that may be used as a light source of a display device according to an embodiment of the disclosure, and FIG. 2 illustrates an example of a cross-section of the light emitting element LD corresponding to line I~I' of FIG. 1.

Referring to FIGS. 1 and 2, the light emitting element LD may include a first semiconductor layer SCL1, an active layer ACT, and a second semiconductor layer SCL2, which may be sequentially disposed along a direction (for example, a length direction), and an insulating film INF surrounding an outer circumferential surface (for example, a side surface)

of the first semiconductor layer SCL1, the active layer ACT, and the second semiconductor layer SCL2. The light emitting element LD may selectively further include an electrode layer ETL disposed on the second semiconductor layer SCL2. The insulating film INF may or may not at least partially surround an outer circumferential surface of the electrode layer ETL. According to an embodiment, the light emitting element LD may further include another electrode layer disposed on a surface (for example, a lower surface) of the first semiconductor layer SCL1.

In an embodiment, the light emitting element LD may be provided (disposed) in a bar (or rod) shape extending along a direction, and may have a first end EP1 and a second end EP2 at both ends of a length direction (or a thickness direction). The first end EP1 may include a first bottom surface (or an upper surface) and/or a peripheral region thereof of the light emitting element LD, and the second end EP2 may include a second bottom surface (or a lower surface) and/or a peripheral region thereof of the light emitting element LD. For example, the electrode layer ETL and/or the second semiconductor layer SCL2 may be disposed on the first end EP1 of the light emitting element LD, and the first semiconductor layer SCL1 and/or at least one electrode layer connected to the first semiconductor layer SCL1 may be disposed on the second end EP2 of the light emitting element LD.

In describing an embodiment of the disclosure, the term "bar shape" may include a rod-like shape or a bar-like shape having an aspect ratio greater than about 1, such as a circular column or a polygonal column, and a shape of a cross section thereof is not particularly limited. For example, a length L of the light emitting element LD may be greater than a diameter D (or a width of the cross section) thereof.

The first semiconductor layer SCL1, the active layer ACT, the second semiconductor layer SCL2, and the electrode layer ETL may be sequentially disposed in a direction from the second end EP2 to the first end EP1 of the light emitting element LD. For example, the first semiconductor layer SCL1 may be disposed on the second end EP2 of the light emitting element LD, and the electrode layer ETL may be disposed on the first end EP1 of the light emitting element LD. In other embodiments, at least one other electrode layer may be disposed on the second end EP2 of the light emitting element LD.

The first semiconductor layer SCL1 may be a semiconductor layer of a first conductivity type. For example, the first semiconductor layer SCL1 may be an N-type semiconductor layer including an N-type dopant. For example, the first semiconductor layer SCL1 may include at least one semiconductor material among InAlGaN, GaN, AlGaN, InGaN, AlN, and InN, and may be an N-type semiconductor layer doped with a dopant such as Si, Ge, and/or Sn. However, the material configuring the first semiconductor layer SCL1 is not limited thereto, and various materials in addition to the above-described materials may configure the first semiconductor layer SCL1.

The active layer ACT may be disposed on the first semiconductor layer SCL1 and may be formed in a single-quantum well or multi-quantum well structure. A position of the active layer ACT may be variously changed according to a type of the light emitting element LD. In an embodiment, the active layer ACT may emit light having a wavelength of about 400 nm to about 900 nm, and may have a double hetero-structure.

A clad layer (not shown) doped with a conductive dopant may be selectively formed on and/or under the active layer ACT. For example, the clad layer may be formed of an AlGaN layer or an InAlGaN layer. According to an embodiment, a material such as AlGaN or AlInGaN may be used to form the active layer ACT, and various materials in addition to the above-described materials may configure the active layer ACT.

In case that a voltage equal to or greater than a threshold voltage is applied to both ends of the light emitting element LD, the light emitting element LD emits light while electron-hole pairs may be combined in the active layer ACT. By controlling light emission of the light emitting element LD using this principle, the light emitting element LD may be used as a light source of various light emitting devices including a pixel of a display device.

The second semiconductor layer SCL2 may be disposed on the active layer ACT and may be a semiconductor layer of a second conductive type different from that of the first semiconductor layer SCL1. For example, the second semiconductor layer SCL2 may include a P-type semiconductor layer including a P-type dopant. For example, the second semiconductor layer SCL2 may include at least one semiconductor material among InAlGaN, GaN, AlGaN, InGaN, AlN, and InN, and may be a P-type semiconductor layer doped with a dopant such as Mg. However, the material configuring the second semiconductor layer SCL2 is not limited thereto, and various materials in addition to the above-described materials may configure the second semiconductor layer SCL2.

In an embodiment, the first semiconductor layer SCL1 and the second semiconductor layer SCL2 may have different lengths (or thicknesses) in the length direction of the light emitting element LD. For example, the first semiconductor layer SCL1 may have a length (or a thickness) longer (or thicker) than that of the second semiconductor layer SCL2 along the length direction of the light emitting element LD. Accordingly, the active layer ACT may be positioned closer to the first end EP1 than the second end EP2.

The electrode layer ETL may be disposed on the second semiconductor layer SCL2. The electrode layer ETL may protect the second semiconductor layer SCL2, and may be an electrode for smoothly connecting the second semiconductor layer SCL2 to an electrode, line, or the like. For example, the electrode layer ETL may be an ohmic contact electrode or a Schottky contact electrode.

The electrode layer ETL may be substantially transparent or translucent. Accordingly, light generated from the light emitting element LD may pass through the electrode layer ETL and be emitted from the light emitting element LD to the outside. In another embodiment, in case that the light generated from the light emitting element LD is emitted from the light emitting element LD without passing through the electrode layer ETL, the electrode layer ETL may be formed to be opaque.

In an embodiment, the electrode layer ETL may include metal or metal oxide. For example, the electrode layer ETL may be formed using a metal such as chromium (Cr), titanium (Ti), aluminum (Al), gold (Au), nickel (Ni), and/or copper (Cu), oxide or alloy thereof, a transparent conductive material such as indium tin oxide (ITO), indium zinc oxide (IZO), indium tin zinc oxide (ITZO), zinc oxide (ZnO), and/or indium oxide ($In_2O_3$), and the like alone or in combination.

The insulating film INF may expose the electrode layer ETL (or the second semiconductor layer SCL2) and the first semiconductor layer SCL1 (or another electrode layer provided on the second end EP2 of the light emitting element LD), respectively, at the first and second ends EP1 and EP2 of the light emitting element LD.

In case that the insulating film INF is provided to cover a surface of the light emitting element LD, particularly the outer circumferential surface of the first semiconductor layer SCL1, the active layer ACT, the second semiconductor layer SCL2, and/or the electrode layer ETL, a short defect through the light emitting element LD may be prevented. Accordingly, electrical stability of the light emitting element LD may be secured. In case that the insulating film INF is provided on the surface of the light emitting element LD, a surface defect of the light emitting element LD may be minimized, and thus a lifespan and efficiency may be improved.

In an embodiment, the light emitting element LD may be manufactured through a surface treatment process. For example, by performing the surface treatment on the light emitting element LD using a hydrophobic material, in case that multiple light emitting elements LD are mixed in a fluid solution (hereinafter referred to as a "light emitting element mixed liquid" or a "light emitting element ink") and supplied to each emission area (for example, an emission area of a pixel), the light emitting elements LD may be uniformly dispersed in the light emitting element mixed liquid without being non-uniformly aggregated.

The insulating film INF may include a transparent insulating material. Accordingly, light generated in the active layer ACT may pass through the insulating film INF and may be emitted to the outside of the light emitting element LD. For example, the insulating film INF may include at least one insulating material among $SiO_2$ (or silicon oxide ($SiO_x$) other than $SiO_2$), $Si_3N_4$ (or silicon nitride ($SiN_x$) other than $Si_3N_4$), $Al_2O_3$ (or aluminum oxide ($Al_xO_y$) other than $Al_2O_3$), $TiO_2$ (or titanium oxide ($Ti_xO_y$) other than $TiO_2$), and hafnium oxide ($HfO_x$), but is not limited thereto.

The insulating film INF may be configured as a single layer or multiple layers. For example, the insulating film INF may be formed of a double film.

In an embodiment, the insulating film INF may be partially etched (or removed) in a region corresponding to at least one of the first end EP1 and the second end EP2 of the light emitting element LD. For example, the insulating film INF may be etched to have a rounded shape in the first end EP1, but the shape of the insulating film INF is not limited thereto.

In an embodiment, the light emitting element LD may have a small size of a range from nanometer (nm) to micrometer (μm). For example, each light emitting element LD may have the diameter D (or a width of a cross section) and/or the length L of the range from nanometer to micrometer. For example, the light emitting element LD may have the diameter D and/or the length L of a range of several tens of nanometers to several tens of micrometers. However, a size of the light emitting element LD may be changed.

A structure, a shape, a size, and/or a type of the light emitting element LD may be changed according to an embodiment. For example, the light emitting element LD may be formed in another structure and/or shape such as a core-shell structure.

A light emitting device including the light emitting element LD may be used in various types of devices that require a light source. For example, multiple light emitting elements LD may be disposed in the pixel of the display device, and the light emitting elements LD may be used as a light source of the pixel. The light emitting element LD may be used in other types of devices that require a light source, such as a lighting device.

Figure 3:
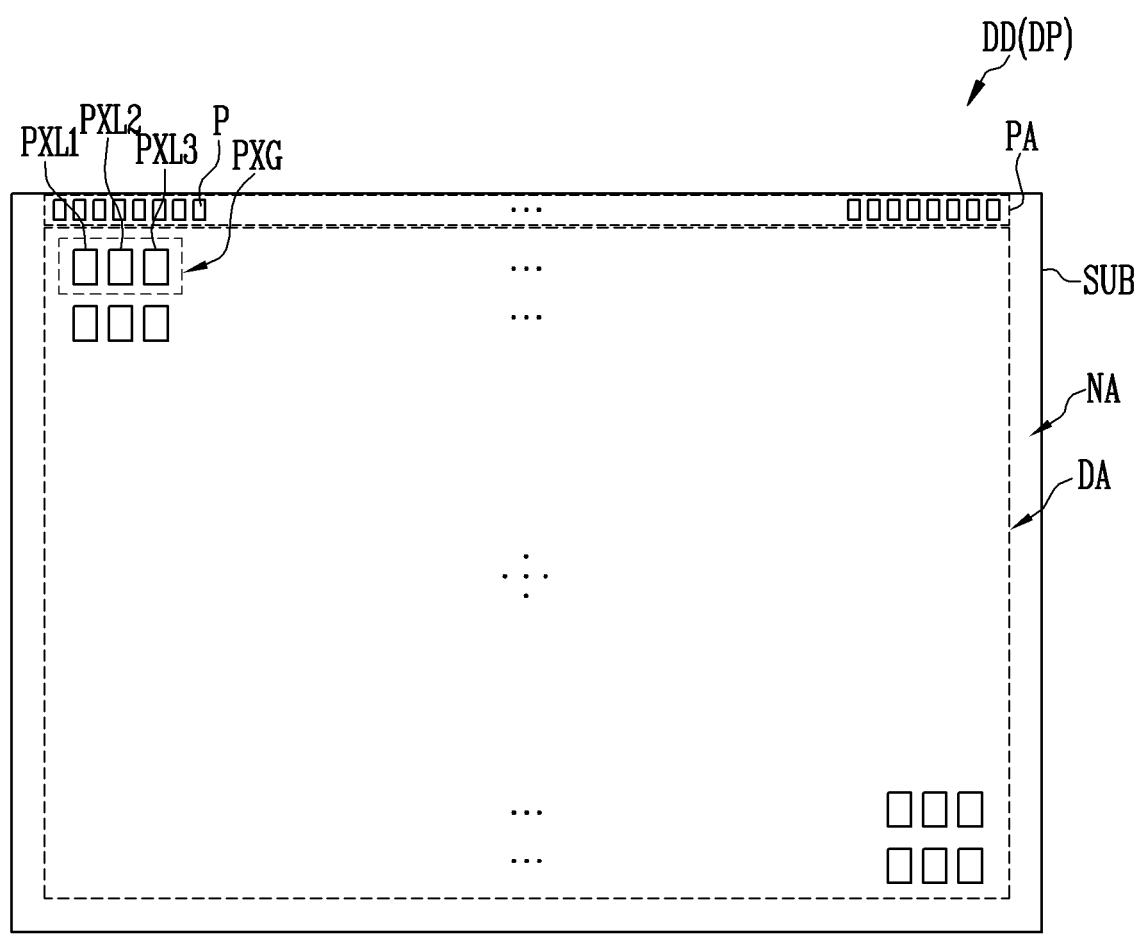
FIG. 3 is a schematic plan view illustrating a display device according to an embodiment.

FIG. 3 is a schematic plan view illustrating a display device DD according to an embodiment of the disclosure.

Figure 4:
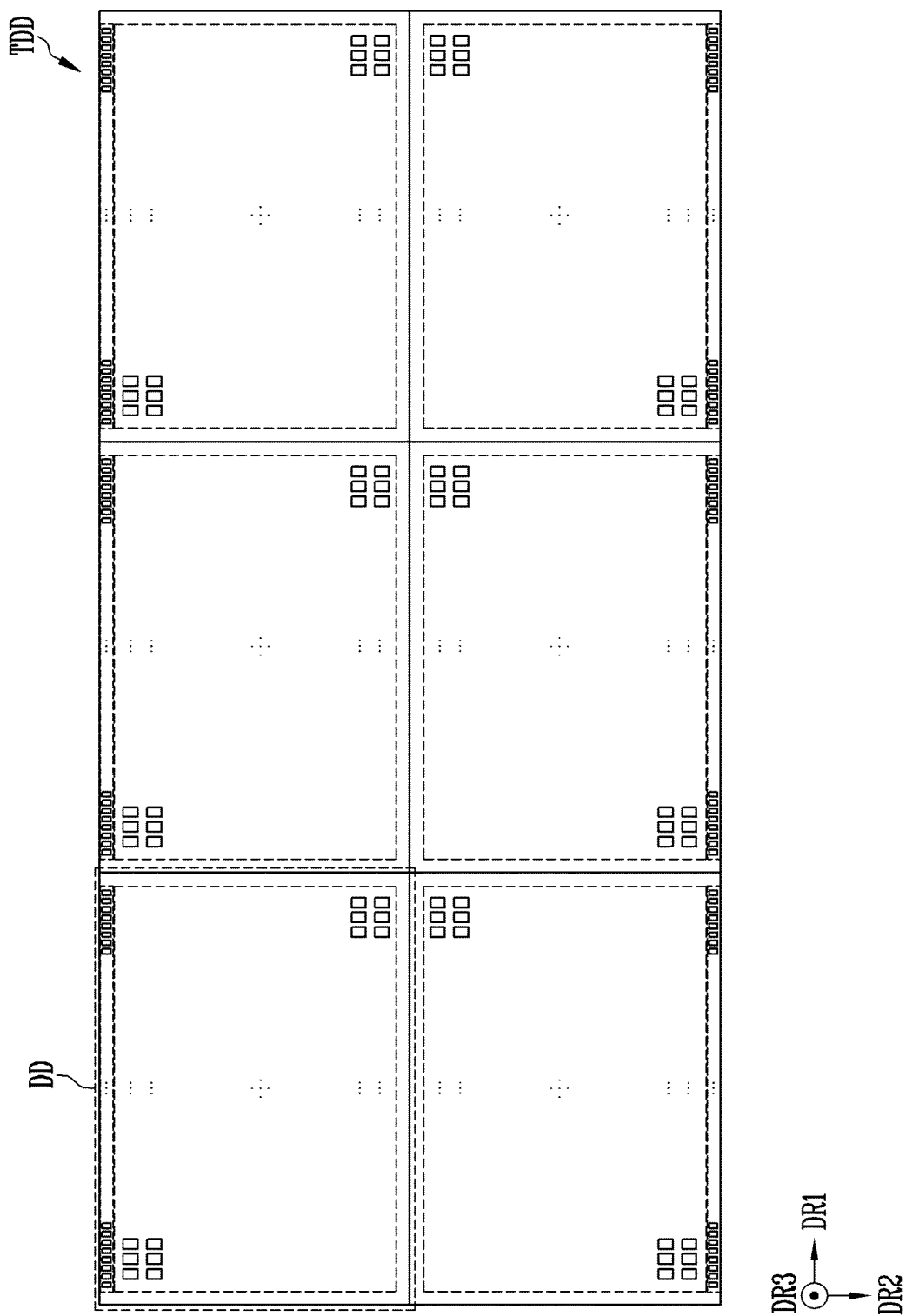
FIG. 4 is a schematic plan view illustrating a tiling display device using the display device of FIG. 3.

FIG. 4 is a schematic plan view illustrating a tiling display device TDD using the display device DD of FIG. 3.

In FIGS. 3 and 4, a structure of the display device DD is briefly shown based on a display panel DP including a display area DA. The display device DD may further include a driving circuit (for example, a scan driver, a data driver, a timing controller, and the like) for driving pixels PXL.

Referring to FIG. 3, the display device DD may include a substrate SUB and pixels PXL disposed on the substrate SUB. The substrate SUB and the display device DD including the substrate SUB may be provided in various shapes. For example, the substrate SUB and the display device DD may be provided in a rectangular plate shape and may include angled corner areas, but is not limited thereto. For example, the substrate SUB and the display device DD may have a circular shape, an elliptical shape, or the like in a plan view.

For convenience, in FIG. 3, the display device DD is shown as having a rectangular plate shape. A horizontal direction (for example, a row direction or a horizontal direction) of the display device DD may be displayed as a first direction DR1, a vertical direction (for example, a column direction or a vertical direction) of the display device DD may be displayed as a second direction DR2, a thickness direction (or a height direction) of the display device DD may be displayed as a third direction DR3.

The substrate SUB may be a base member for configuring the display device DD, and may configure, for example, a base surface of the display device DD. The substrate SUB may be a rigid substrate (for example, a glass substrate or a tempered glass substrate) of a hard material, or a flexible substrate (for example, a thin film) of a flexible material that may be deformed such as bending, folding, being curved, or the like. A material and a physical property of the substrate SUB are not particularly limited.

The substrate SUB and the display device DD including the substrate SUB may include the display area DA for displaying an image and a non-display area NA positioned around the display area DA.

The display area DA may be an area in which the pixels PXL may be disposed, and may be an area in which an image may be displayed by the pixels PXL. In an embodiment, the display area DA may be disposed in a center area (for example, a center area of the display panel DP) of the substrate SUB and the display device DD.

The display area DA may have various shapes. For example, the display area DA may have various shapes including a rectangle, a circle, or an ellipse. In an embodiment, the display area DA may have a shape corresponding to a shape of the substrate SUB, but is not limited thereto.

The non-display area NA may be a remaining area except for the display area DA. In an embodiment, the non-display area NA may be disposed in an edge area of the substrate SUB and the display device DD to surround the display area DA. A portion of the non-display area NA may be a pad area PA in which pads P may be disposed.

The pixels PXL may be arranged in the display area DA. For example, the display area DA may include pixel areas in which each pixel PXL may be disposed. The pixels PXL may be regularly arranged in the display area DA according to a stripe or PenTile® arrangement structure. The pixels PXL may be arranged in the display area DA in various structures and/or methods.

In an embodiment, at least two types of pixels PXL for emitting light of different colors may be provided in the display area DA. For example, in the display area DA, first color pixels PXL1, second color pixels PXL2, and third color pixels PXL3 may be regularly arranged. At least one first color pixel PXL1, at least one second color pixel PXL2, and at least one third color pixel PXL3 disposed adjacent to each other may configure a pixel group PXG. By individually controlling a luminance of the first to third color pixels PXL1 to PXL3 included in each pixel group PXG, a color of light emitted from the pixel group PXG may be variously changed.

In an embodiment, as shown in FIG. 3, the first color pixels PXL1, the second color pixels PXL2, and the third color pixels PXL3 successively arranged along the first direction DR1 may configure a pixel group PXG, but the disclosure is not limited thereto. For example, the number, type, mutual disposition structure, and/or the like of the pixels PXL configuring each pixel group PXG may be variously changed according to an embodiment.

In an embodiment, the first color pixel PXL1 may be a red pixel for emitting red light, and the second color pixel PXL2 may be a green pixel for emitting green light. The third color pixel PXL3 may be a blue pixel for emitting blue light. The color of the light emitted from the pixels PXL configuring each pixel group PXG may be variously changed.

In an embodiment, each pixel PXL may include at least one light source. For example, each pixel PXL may include the light emitting element LD according to the embodiments of FIGS. 1 and 2, for example, at least one rod-like shape light emitting element LD having a small size of a range of nanometer to micrometer. Each pixel PXL may include organic or inorganic light emitting elements of different types, sizes, numbers, and/or the like.

In an embodiment, the first color pixel PXL1, the second color pixel PXL2, and the third color pixel PXL3 may include a first color light emitting element, a second color light emitting element, and a third color light emitting element as light sources, respectively. Accordingly, the first color pixel PXL1, the second color pixel PXL2, and the third color pixel PXL3 may emit light of a first color, a second color, and a third color, respectively.

In another embodiment, the first color pixel PXL1, the second color pixel PXL2, and the third color pixel PXL3 may include light emitting elements emitting light of a same color, and a light conversion layer including wavelength conversion particles (for example, particles that convert a color and/or a wavelength of light, such as a quantum dot) may be disposed in an emission area of the first color pixel PXL1, the second color pixel PXL2, and/or the third color pixel PXL3. Accordingly, the first color pixel PXL1, the second color pixel PXL2, and the third color pixel PXL3 may be controlled to emit the light of the first color, the second color, and the third color, respectively. For example, the first color pixel PXL1, the second color pixel PXL2, and the third color pixel PXL3 may include light emitting elements emitting light of the third color, and a light conversion layer including a red quantum dot may be disposed in an emission area of the first color pixel PXL1, a light conversion layer including a green quantum dot may be disposed in an emission area of the second color pixel PXL2. Accordingly, the first color pixel PXL1 may emit red light, and the second color pixel PXL2 may emit green light.

The pixels PXL may have a structure according to at least one of the embodiments to be described below. For example, the pixels PXL may have a structure to which one of the embodiments to be described later is applied, or a structure to which at least two embodiments may be applied in combination.

In an embodiment, the pixel PXL may be configured as an active pixel, but is not limited thereto. For example, in another embodiment, the pixel PXL may be configured as a passive pixel.

Lines connected to the pixels PXL of the display area DA and/or a built-in circuit unit may be disposed in the non-display area NA. A portion of the non-display area NA may be set as (include) the pad area PA, and the pads P may be disposed in the pad area PA. The pads P may include signal pads and/or power pads for supplying various driving signals and/or power (for example, driving signals and/or power for driving the pixels PXL of the display panel DP) necessary for driving the pixels PXL to the display device DD.

In an embodiment, the non-display area NA may have a very narrow width. For example, the non-display area NA may include an organic layer-free area as in embodiments to be described later, and thus may have a reduced width of about 50 micrometers (μm) or less. Accordingly, the display device DD may be implemented as a bezel-less display device.

Damage to an edge area of the display device may be prevented or minimized in a manufacturing process (for example, a cutting process, a polishing process, and/or the like) of the display device DD, by forming at least one of a corner area and an outermost (outer) edge area of the substrate SUB as the organic layer-free area. Accordingly, the width of the non-display area NA may be effectively reduced.

The display device DD in which the non-display area NA may be reduced may provide a larger screen compared to the entire size (for example, area). The display device DD in which the non-display area NA may be reduced and/or removed may be usefully used to configure a tiling display device (for example, the tiling display device of FIG. 4) or the like.

Referring to FIGS. 3 and 4, the tiling display device TDD may be configured by arranging multiple display devices DD in the first direction DR1 and/or the second direction DR2. For example, the tiling display device TDD realizing a larger screen may be configured, by disposing the display devices DD in close contact with each other in the first direction DR1 and the second direction DR2.

In an embodiment, the pad areas PA of the display devices DD may be disposed only in the edge area corresponding to a side (or a portion) of each substrate SUB. The display devices DD may be arranged so that the pad areas PA of the display devices DD may be positioned in the edge area of the tiling display device TDD. For example, in case that the tiling display device DD includes the display devices DD arranged in two rows, the display devices DD positioned in a first row of the tiling display device DD may be arranged so that each of the pad areas PA may be positioned on an upper end of the tiling display device DD, and the display devices DD positioned in a second row of the tiling display device DD may be arranged so that each of the pad areas PA may be positioned on a lower end of the tiling display device DD. Accordingly, driving signals and/or power may be smoothly supplied to the display devices DD.

In an embodiment, at least one of the corner area and the outermost edge area of each of the display devices DD may be set as the organic layer-free area, and thus damage to each non-display area NA may be prevented or reduced in the manufacturing process of the display devices DD. Accordingly, the non-display area NA of the display devices DD may be reduced.

In case that the non-display area NA of each of the display devices DD is reduced, a distance between the display areas DA of adjacent display devices DD may be reduced. Accordingly, a boundary between the display devices may be prevented or minimized DD from being recognized and a seamless tiling display device may be configured.

Figure 5:
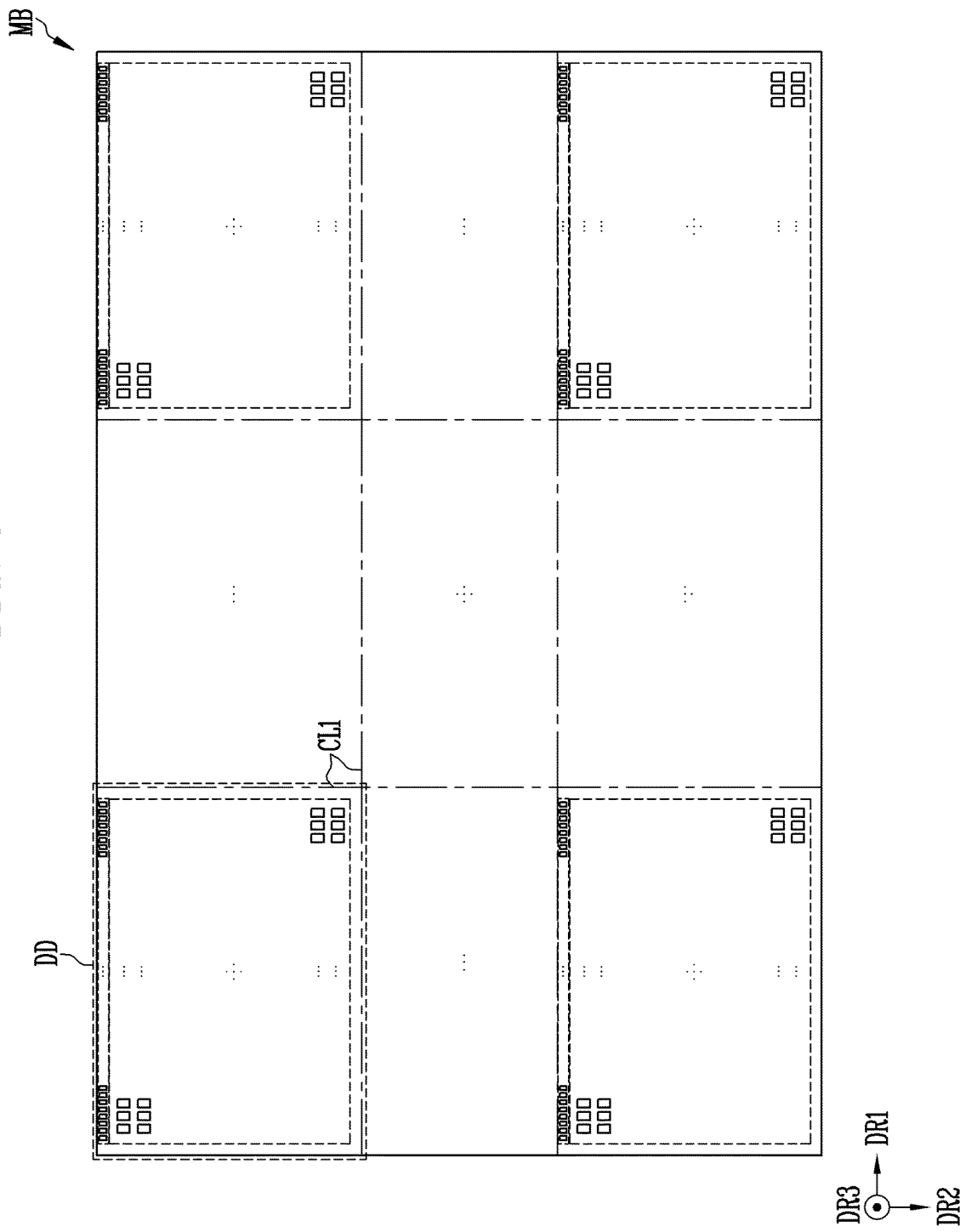
FIG. 5 is a schematic plan view illustrating a manufacturing substrate according to an embodiment of the disclosure.

FIG. 5 is a schematic plan view illustrating a manufacturing substrate MB according to an embodiment of the disclosure. For example, FIG. 5 schematically shows the manufacturing substrate MB for manufacturing the display device DD of FIG. 3.

Referring to FIGS. 3 and 5, after simultaneously manufacturing multiple display devices DD on one manufacturing substrate MB (also referred to as a "mother substrate"), the display devices DD may be individually separated to manufacture each display device DD. For example, after completing a process for forming the display devices DD on the manufacturing substrate MB, the display devices DD may be individually separated by cutting the manufacturing substrate MB along a cutting line CL1.

In an embodiment, each display device DD may be separated from the manufacturing substrate MB through a laser cutting process using a laser. In case that the substrate SUB is cut using a laser, damage to the substrate SUB may be reduced or minimized. In an embodiment, after the laser cutting process may be completed, a polishing process or the like may be performed.

In an embodiment, a partial area of the display device DD that may be vulnerable to damage due to a cutting process may be set as the organic layer-free area. For example, at least a portion of the edge area (for example, the non-display area NA) of the display device DD that may belong to a heat affected zone HAZ in the laser cutting process may be set as the organic layer-free area.

For example, the corner area (for example, corner areas where the cutting lines CL1 along the first and second directions DR1 and DR2 meet in case that the substrate SUB has a quadrangular plate shape) and/or the outermost edge area of the substrate SUB corresponding to the cutting line CL1 (or directly adjacent to the cutting line CL1) may be set as the organic layer-free area. Accordingly, damage to the display device DD due to the cutting process for separating the display device DD from the manufacturing substrate MB may be prevented or reduced.

For example, an organic insulating layer may be removed in the corner area and/or the outermost edge area of the substrate SUB so that the corner area and/or the outermost edge area of the substrate SUB most vulnerable to damage during the cutting process does not include the organic insulating layer. Accordingly, damage to the organic insulating layer due to the cutting process and/or the polishing process (for example, a phenomenon in which the organic insulating layer may be lifted or peeled) may be prevented or reduced. In an embodiment, in case that the substrate SUB does not have an angled corner area (for example, in case that the substrate SUB has a circular shape or an elliptical shape), the outermost edge area and the pad area PA of the substrate SUB may be set as the organic layer-free area. According to the above-described embodiment, a cutting tolerance may be reduced or minimized, and the non-display area NA of the display device DD may be reduced.

Figure 6:
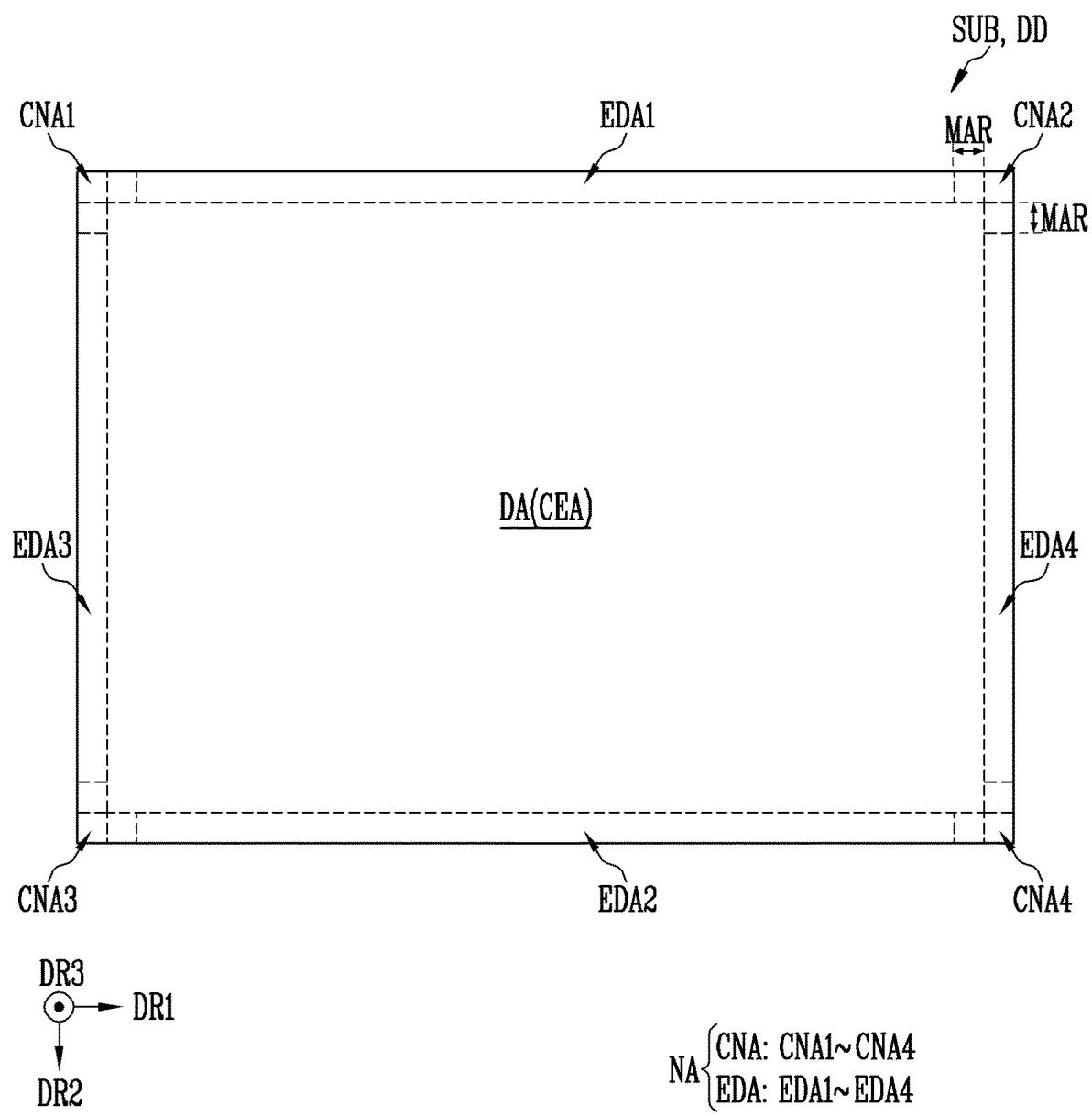
FIGS. 6 to 8 are schematic plan views illustrating different areas of a substrate and a display device including the substrate according to an embodiment of the disclosure.
Figure 7:
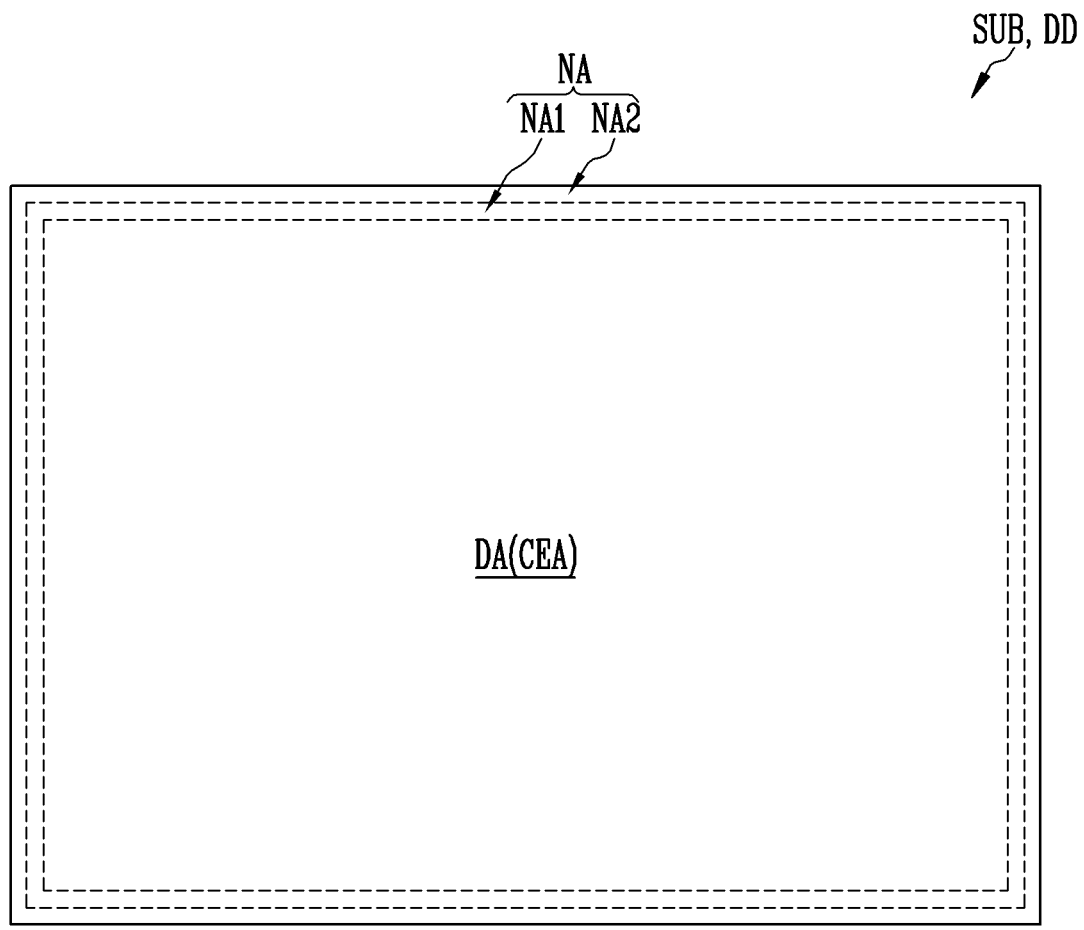
Figure 7:
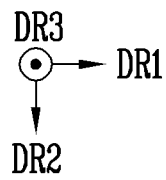
Figure 8:
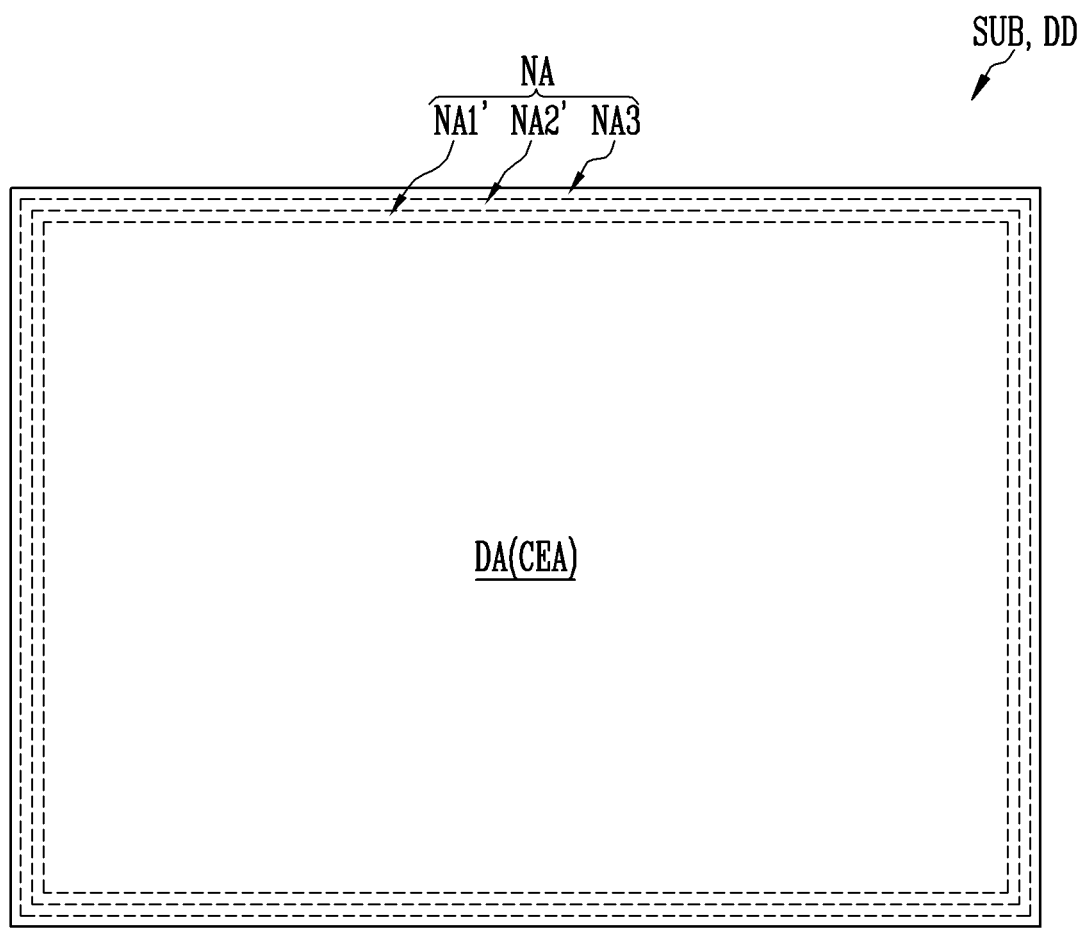

FIGS. 6 to 8 are schematic plan views illustrating different areas of the substrate SUB and the display device DD including the substrate SUB according to an embodiment of the disclosure. For example, FIGS. 6 to 8 illustrate different areas of the substrate SUB of FIG. 3 and the display device DD including the substrate SUB, divided by each embodiment, and illustrate different embodiments in relation to the non-display area NA.

Referring to FIGS. 6 to 8, the substrate SUB and the display device DD may include the display area DA positioned in the center area CEA and the non-display area NA surrounding the display area DA and positioned in the edge area EDA. In an embodiment, the substrate SUB and the display device DD may include edge areas EDA positioned in different portions of the non-display area NA.

Referring to FIG. 6, the substrate SUB and the display device DD may include the edge areas EDA positioned in different portions of the non-display area NA, and the corner areas CNA where the edge areas EDA meet. For example, the substrate SUB and the display device DD may include a first edge area EDA1 corresponding to an upper area of the non-display area NA, a second edge area EDA2 corresponding to a lower area of the non-display area NA, a third edge area EDA3 corresponding to a left area of the non-display area NA, and a fourth edge area EDA4 corresponding to a right area of the non-display area NA. The substrate SUB and the display device DD may include a first corner area CNA1 (for example, a upper left area of the non-display area NA) where the first edge area EDA1 and the third edge area EDA3 meet, a second corner area CNA2 (for example, an upper right area of the non-display area NA) where the first edge area EDA1 and the fourth edge area EDA4 meet, a third corner area CNA3 (for example, a lower left area of the non-display area NA) where the second edge area EDA2 and the third edge area EDA3 meet, and a fourth edge area EDA4 (for example, a lower right area of the non-display area NA) where the second edge area EDA2 and the fourth corner area CNA4 meet.

In an embodiment, each edge area EDA may include at least one corner area CNA corresponding thereto, or may overlap the corner area CNA. In other embodiments, each edge area EDA may be an area that does not include the corner area CNA. For example, each corner area CNA may be an area included in two edge areas EDA corresponding thereto, or may be an area directly adjacent to the two edge areas EDA and may be distinguished from the two edge areas EDA.

The at least one edge area EDA may include a pad area (for example, the pad area PA of FIG. 3). For example, the first edge area EDA1 may include the pad area PA in which the pads P may be disposed as in the embodiment of FIG. 3.

In an embodiment, each corner area CNA may include a margin area MAR of a range in the first direction DR1 and/or the second direction DR2. In other embodiments, each corner area CNA may be an area that does not include the margin area MAR.

Referring to FIG. 7, the substrate SUB and the display device DD may correspond to different portions of the non-display area NA and may have perimeters of different lengths. For example, the non-display area NA may include a first non-display area NA1 directly adjacent to the display area DA and surrounding the display area DA, and a second non-display area NA2 directly adjacent to the first non-display area NA1 and surrounding the first non-display area NA1. In an embodiment, the second non-display area NA2 may be an area of a range and/or size including the outermost edge area of the substrate SUB among the non-display area NA, and the remaining non-display area NA may be the first non-display area NA1.

Referring to FIG. 8, the substrate SUB and the display device DD may include three or more divided areas corresponding to different portions of the non-display area NA and having perimeters of different lengths. For example, the non-display area NA may include a first non-display area NA1' directly adjacent to the display area DA and surrounding the display area DA, a second non-display area NA2' directly adjacent to the first non-display area NA1' and surrounding the first non-display area NA1', and a third non-display area NA3 surrounding the second non-display area NA2' and including the outermost edge area of the substrate SUB.

In an embodiment, the third non-display area NA3 may be an area directly adjacent to the second non-display area NA2', but is not limited thereto. For example, in case that the non-display area NA includes four or more divided areas sequentially disposed to surround the display area DA, the second non-display area NA2' and the third non-display area NA3 may not be in contact with each other.

FIGS. 9 to 12 are schematic plan views of a display device DD according to an embodiment of the disclosure. For example, FIGS. 9 to 12 illustrate different embodiments in relation to an inorganic insulating layer IL and an organic insulating layer OL that may be provided to the display device DD or the like according to the embodiment of FIG. 3. In describing the embodiments of FIGS. 9 to 12, the same reference numerals are given to configurations similar or identical to each other, and a repetitive description is omitted.

Referring to FIGS. 3 to 9, at least one inorganic insulating layer IL may be disposed in the display area DA and the non-display area NA. For example, the inorganic insulating layer IL may be provided on the substrate SUB, and may be entirely disposed on one surface of the substrate SUB including the display area DA and the non-display area NA.

Figure 9:
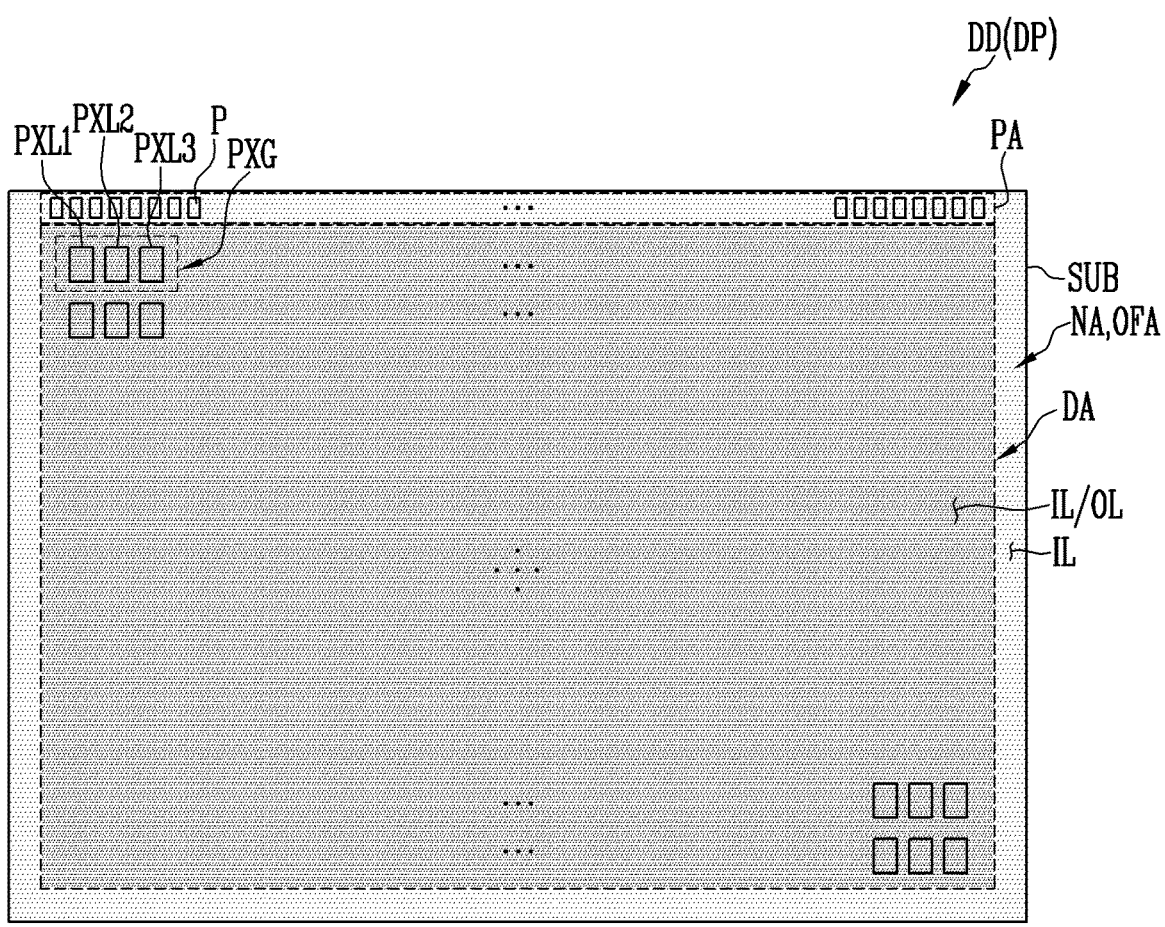
FIGS. 9 to 12 are schematic plan views of a display device according to an embodiment of the disclosure.

FIG. 9 schematically and/or entirely illustrates an area where the inorganic insulating layer IL may be disposed, and the inorganic insulating layer IL may be entirely disposed on the pads P, but the disclosure is not limited thereto. For example, the inorganic insulating layer IL may be locally or partially opened in an area corresponding to at least one portion of the pads P.

The pixels PXL may be provided on the substrate SUB to overlap the inorganic insulating layer IL. For example, the pixels PXL may be disposed in the display area DA on the substrate SUB to overlap a portion of the inorganic insulating layer IL.

In addition to the inorganic insulating layer IL and the pixels PXL, the organic insulating layer OL may be disposed in the display area DA. For example, at least one organic insulating layer OL may be disposed in the display area DA.

The organic insulating layer OL may be provided on the substrate SUB to overlap the inorganic insulating layer IL and the pixels PXL. For example, the organic insulating layer OL may be disposed in the display area DA on the substrate SUB to overlap a portion of the inorganic insulating layer IL. The organic insulating layer OL may be entirely disposed in the display area DA to completely overlap the pixels PXL (or to completely cover the pixels PXL). For example, the organic insulating layer OL may be entirely disposed in the display area DA to planarize a surface of the display area DA.

In an embodiment, the non-display area NA may include an organic layer-free area OFA. The organic layer-free area OFA may be an area that may not include the organic insulating layer OL (for example, an area in which the organic insulating layer OL may not be formed or may be removed). For example, the organic insulating layer OL may be provided on only a portion of the substrate SUB to be disposed in a remaining area except for the organic layer-free area OFA.

In an embodiment, the organic layer-free area OFA may be set to the entire non-display area NA. The organic insulating layer OL may be disposed only in the display area DA.

As described above, in case that the non-display area NA (for example, the entire area of the non-display area NA) positioned in the edge area EDA of the display device DD is set as the organic layer-free area OFA, damage to the organic insulating layer OL may be effectively prevented or reduced in the cutting process and/or the polishing process for individually separating the display device DD. Accordingly, the cutting tolerance may be reduced or minimized, and the non-display area NA of the display device DD may be reduced.

Referring to FIGS. 3 to 12, a portion (or an area) of the non-display area NA may be set as the organic layer-free area OFA, and the organic insulating layer OL may be provided in a remaining portion (or a remaining area) of the non-display area NA. For example, the organic insulating layer OL may be further provided in a portion of the non-display area NA except for the organic layer-free area OFA, in addition to the display area DA.

In an embodiment, each corner area CNA (for example, the first to fourth corner areas CNA1 to CNA4 and/or the margin areas MAR of FIG. 6) of the non-display area NA may be set as the organic layer-free area OFA. An area (for example, the first edge area EDA1 of FIG. 6) of the non-display area NA corresponding to the pad area PA may be set as the organic layer-free area OFA. For example, the organic layer-free area OFA may include the first to fourth corner areas CNA1 to CNA4 including respective margin areas MAR along the first direction DR1 and the second direction DR2, and the first edge area EDA1 corresponding to the pad area PA.

In an embodiment, the organic insulating layer OL may be provided in a portion of the non-display area NA except for the organic layer-free area OFA. For example, in addition to the display area DA, the organic insulating layer OL may be further disposed in at least a portion of the remaining edge areas (for example, the second to fourth edge areas EDA2 to EDA4) except for the first edge area EDA1. For example, in each of the second to fourth edge areas EDA2 to EDA4, the organic insulating layer OL may be disposed in a center area except for both ends corresponding to the corner areas CNA.

Figure 10:
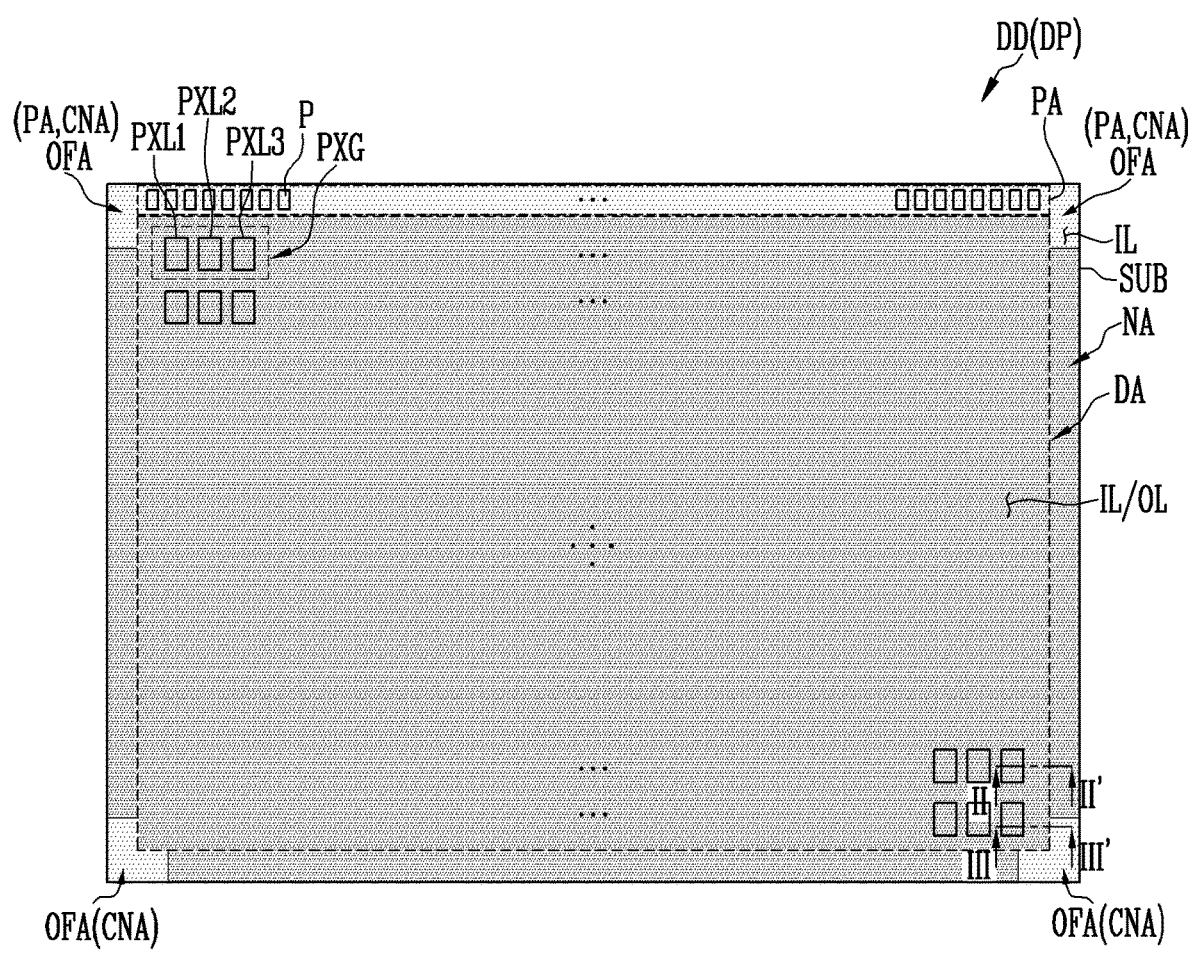
Figure 10:
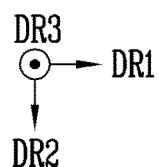

In an embodiment, the organic insulating layer OL may have a width corresponding to the entire width in the center area of each of the remaining edge areas, as in the embodiment of FIG. 10. For example, the organic insulating layer OL may have a width corresponding to the entire width along the first direction DR1 or the second direction DR2 in each of the second to fourth edge areas EDA2 to EDA4. For example, as shown in FIG. 10, the organic insulating layer OL may have a width substantially equal to a width of the second edge area EDA2 along the second direction DR2 with respect to the second edge area EDA2 of FIG. 6. As shown in FIG. 10, the organic insulating layer OL may have a width substantially equal to a width of each of the third edge area EDA3 and the fourth edge area EDA4 along the first direction DR1 with respect to the third edge area EDA3 and the fourth edge area EDA4 of FIG. 6.

As described above, together with the pad area PA, only a portion of the non-display area NA most vulnerable to damage due to the cutting process and/or the polishing process may be set as the organic layer-free area OFA. A surface step difference (for example, a height difference) between the display area DA and the non-display area NA may be reduced or alleviated while reducing the non-display area NA by preventing or reducing damage to the organic insulating layer OL in the cutting process and/or the polishing process of the display device DD. Accordingly, a module process (for example, a film attaching process or the like) that may be followed after the cutting process may be more readily performed. In case that the display device DD is used, a surface step difference in a boundary area of the display devices DD may be alleviated when the tiling display device TDD is more readily configured.

Figure 11:
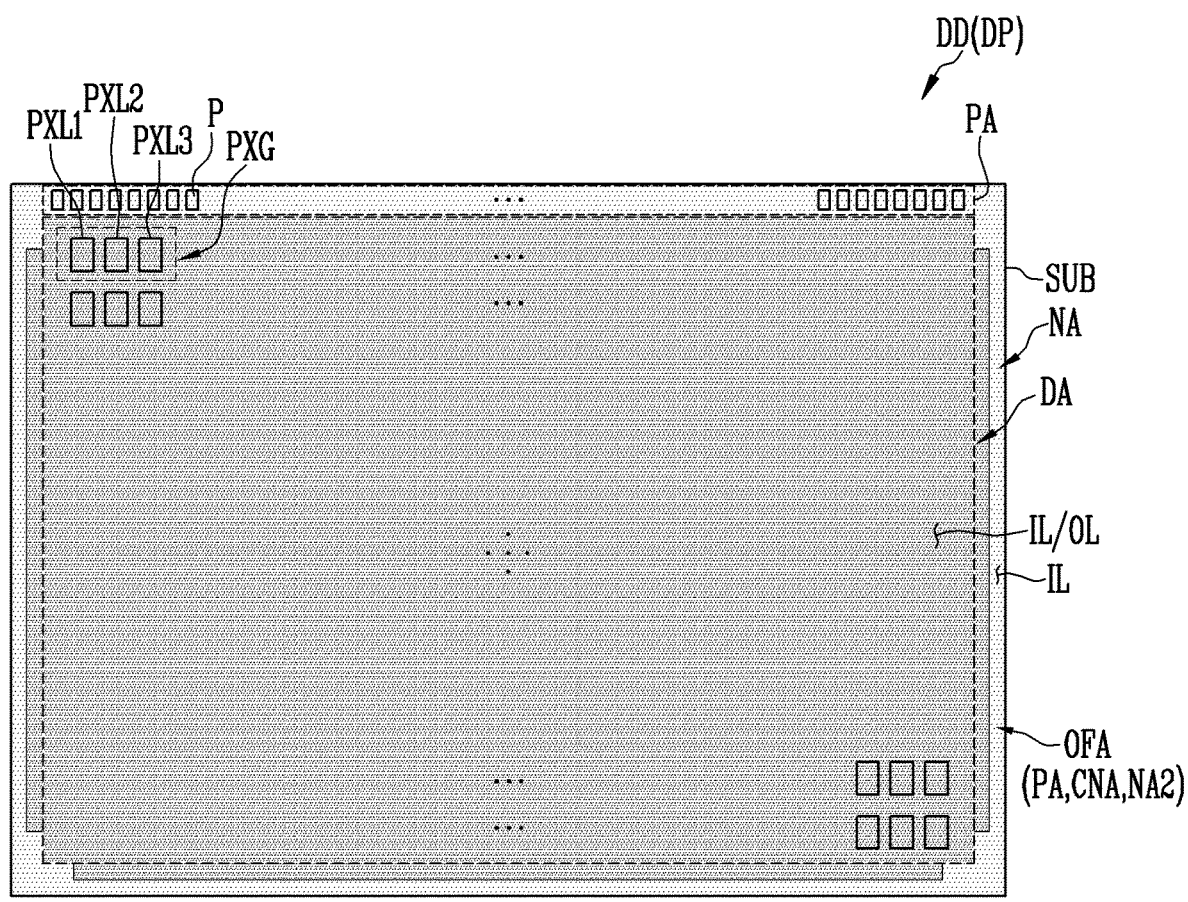
Figure 12:
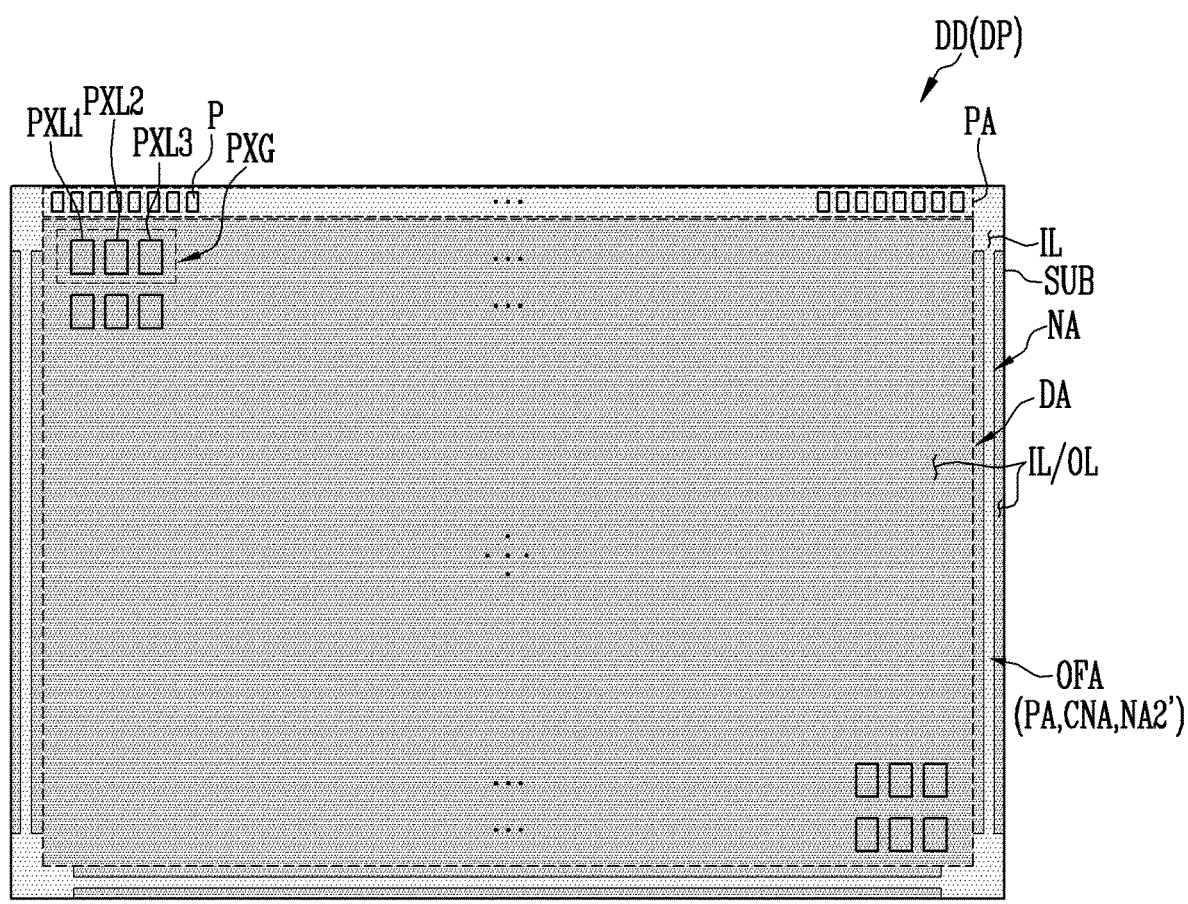

As in the embodiments of FIGS. 11 and 12, the organic insulating layer OL may have a width less than a width of each of the second to fourth edge areas EDA2 to EDA4 in a center area of each of the second to fourth edge areas EDA2 to EDA4. For example, the organic insulating layer OL may be partially disposed in the center area of each of the second to fourth edge areas EDA2 to EDA4.

For example, in an embodiment in which the non-display area NA includes the first and second non-display areas NA1 and NA2 as in the embodiment of FIG. 7, the organic insulating layer OL may be disposed only in the first non-display area NA1 and may not be disposed in the second non-display area NA2 in the center area (for example, an area except for the corner areas CNA positioned at both ends in a longitudinal direction) of each of the second to fourth edge areas EDA2 to EDA4 as in the embodiment of FIG. 11. The second non-display area NA2 may correspond to the outermost edge area of the substrate SUB. The outermost edge area and the corner areas CNA of the substrate SUB may be set as the organic layer-free area OFA, and the organic insulating layer OL may be disposed in the remaining area except for the outermost edge area and the corner areas CNA of the substrate SUB.

As described above, together with the pad area PA and the corner areas CNA, only a portion of the non-display area NA including the outermost edge area of the substrate SUB may be set as the organic layer-free area OFA. A surface step difference of the display device DD may be generally alleviated while reducing the non-display area NA by preventing or reducing damage to the organic insulating layer OL in the cutting process and/or polishing process of the display device DD. For example, damage to the organic insulating layer OL may be prevented or reduced by setting the outermost edge area of the substrate SUB that may be damaged in the polishing process or the like (for example, the organic insulating layer OL may be peeled) as the organic layer-free area OFA, together with the corner areas CNA of the substrate SUB that may be damaged in the cutting process or the like.

In another embodiment in which the non-display area NA may include the first, second, and third non-display areas NA1', NA2', and NA3 as in the embodiment of FIG. 8, the organic insulating layer OL may be disposed only in the first non-display area NA1' and the third non-display area NA3 and may not be disposed in the second non-display area NA2' in the center area of each of the second to fourth edge areas EDA2 to EDA4 as in the embodiment of FIG. 12. For example, in the center area of each of the second to fourth edge areas EDA2 to EDA4, the second non-display area NA2' may be set as the organic layer-free area OFA, and the organic insulating layer OL may be opened in a slit shape in an area corresponding to the second non-display area NA2'.

In an embodiment, the third non-display area NA3 may be an area corresponding to the outermost edge area of the substrate SUB. The organic insulating layer OL disposed in the third non-display area NA3 may be separated from the organic insulating layer OL disposed in the display area DA and/or the first non-display area NA1'. Accordingly, even though the organic insulating layer OL disposed on the third non-display area NA3 may be damaged or peeled in the cutting process, the polishing process, and/or the like, the organic insulating layer OL disposed in the display area DA and/or the first non-display area NA1' may be prevented from being damaged. For example, by opening and/or separating the organic insulating layer OL in the second non-display area NA2', propagation of damage to the organic insulating layer OL, which may occur in the third non-display area NA3, to the display area DA and/or the first non-display area NA1' may be blocked.

In accordance with the display device DD according to the above-described embodiments, at least a partial area of the non-display area NA positioned in the edge area EDA of the substrate SUB may be set as the organic layer-free area OFA, and the organic insulating layer OL may not be provided and/or formed in the organic layer-free area OFA. For example, at least a partial area of the non-display area NA including at least one of the corner area CNA and the outermost edge area of the display device DD belonging to a heat affected zone HAZ and/or a vulnerable portion readily damaged in the cutting process, the polishing process, and the like may be set as the organic layer-free area OFA.

Accordingly, damage to the substrate SUB may be reduced by separating the display device DD from the manufacturing substrate MB through a laser cutting process using a laser. Damage to the organic insulating layer OL due to a laser or the like may be prevented or reduced.

In embodiments of the disclosure, the cutting process of the display device DD is not limited to the laser cutting process. For example, the display device DD may be separated from the manufacturing substrate MB by another process and/or method such as a wheel scribing process. Also, as in the embodiments of the disclosure, by setting at least a portion of the non-display area NA as the organic layer-free area OFA, damage to the organic insulating layer OL which may be vulnerable to peeling or the like may be prevented or reduced According to embodiments of the disclosure, damage to the display device DD due to a cutting process or the like for separating the display device DD from the manufacturing substrate MB may be prevented or reduced. Accordingly, the cutting tolerance may be reduced or minimized, and the non-display area of the display device DD may be reduced or minimized.

Figure 13:
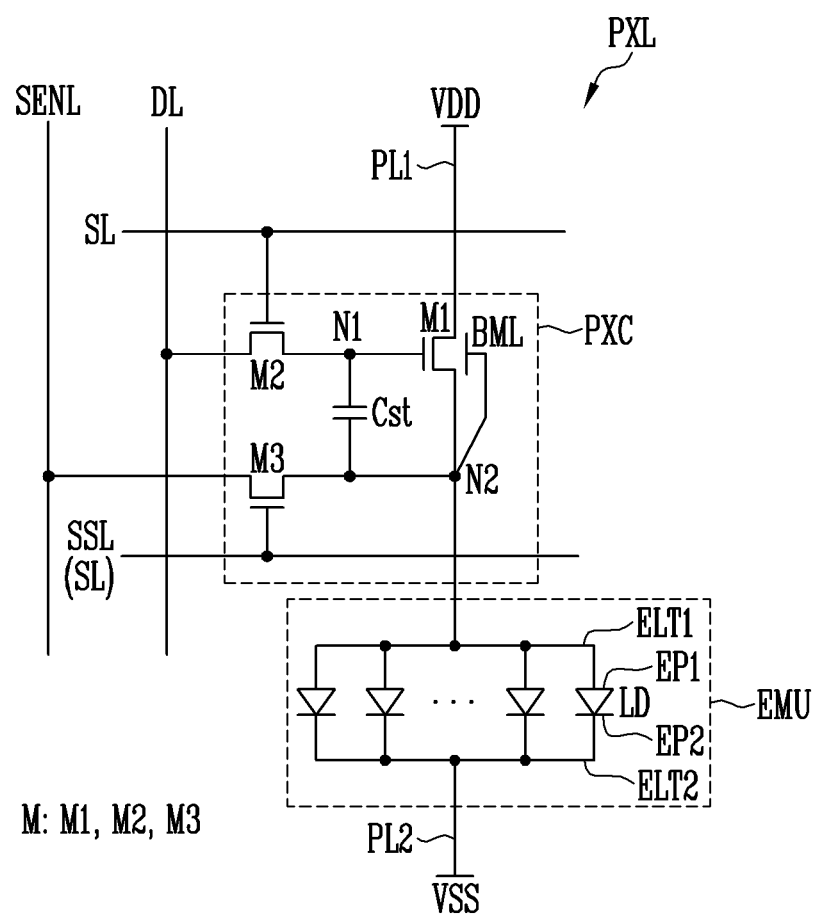
FIGS. 13 and 14 are schematic circuit diagrams illustrating a pixel according to an embodiment of the disclosure.
Figure 14:
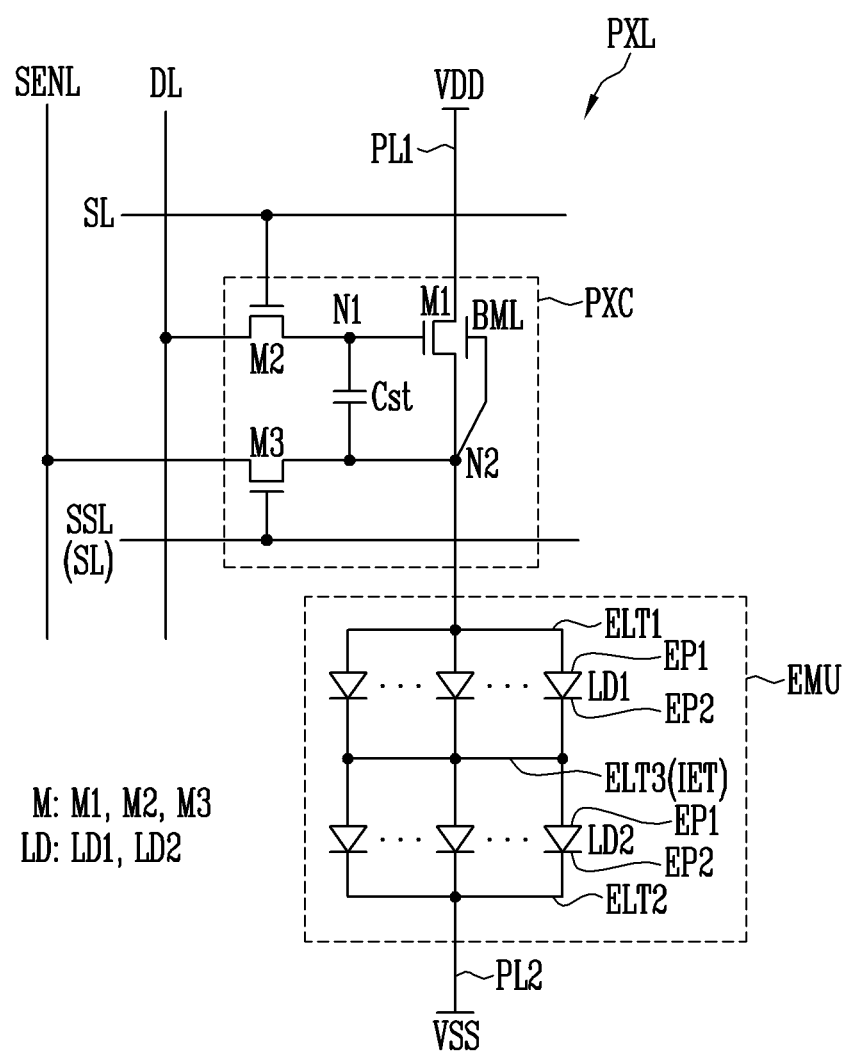

FIGS. 13 and 14 are schematic circuit diagrams illustrating a pixel PXL according to an embodiment of the disclosure. For example, FIGS. 13 and 14 illustrate the pixels PXL including light emitting units EMU of different structures.

According to an embodiment, each of the pixels PXL shown in FIGS. 13 and 14 may be any one of the pixels PXL disposed in the display area DA of FIGS. 3 to 12. The pixels PXL disposed in the display area DA may have structures substantially the same as or similar to each other.

Referring to FIGS. 13 and 14, the pixel PXL may be connected to a scan line SL, a data line DL, a first power line PL1, and a second power line PL2. The pixel PXL may be selectively further connected to at least one other power line and/or signal line. For example, the pixel PXL may be further connected to a sensing line SENL (also referred to as an "initialization power line") and/or a control line SSL.

The pixel PXL may include the light emitting unit EMU (or light emitting part) for generating light of a luminance corresponding to each data signal. The pixel PXL may further include a pixel circuit PXC for driving the light emitting unit EMU.

The pixel circuit PXC may be connected to the scan line SL and the data line DL. The pixel circuit PXC may be connected between the first power line PL1 and the light emitting unit EMU. For example, the pixel circuit PXC may be connected to the scan line SL to which a first scan signal may be supplied, the data line DL to which a data signal may be supplied, the first power line PL1 to which first power VDD may be supplied, and a first pixel electrode ELT1 of the light emitting unit EMU.

The pixel circuit PXC may be selectively further connected to the control line SSL to which a second scan signal may be supplied, and the sensing line SENL connected to reference power (or initialization power) or a sensing circuit in response to a display period or a sensing period. In an embodiment, the second scan signal may be the same as or different from the first scan signal. In case that the second scan signal is the same as the first scan signal, the control line SSL may be integrated with the scan line SL.

The pixel circuit PXC may include at least one transistor M and a capacitor Cst. For example, the pixel circuit PXC may include a first transistor M1, a second transistor M2, a third transistor M3, and the capacitor Cst.

The first transistor M1 may be connected between the first power line PL1 and a second node N2. The second node N2 may be a node to which the pixel circuit PXC and the light emitting unit EMU may be connected. For example, the second node N2 may be a node in which one electrode (for example, a source electrode) of the first transistor M1 and the first pixel electrode (for example, an anode electrode) of the light emitting unit EMU may be electrically connected to each other. A gate electrode of the first transistor M1 may be connected to a first node N1. The first transistor M1 may control a driving current supplied to the light emitting unit EMU in response to a voltage of the first node N1. For example, the first transistor M1 may be a driving transistor of the pixel PXL.

In an embodiment, the first transistor M1 may further include a bottom metal layer (BML) (also referred to as a "back gate electrode" or a "second gate electrode"). In an embodiment, the bottom metal layer BML may be connected to the one electrode (for example, the source electrode) of the first transistor M1.

In an embodiment in which the first transistor M1 includes the bottom metal layer BML, a back-biasing technique (or a sync technique) that moves a threshold voltage of the first transistor M1 in a negative direction or a positive direction by applying a back-biasing voltage to the bottom metal layer BML of the first transistor M1 may be applied. In case that the bottom metal layer BML is disposed under a semiconductor pattern configuring a channel of the first transistor M1, light incident on the semiconductor pattern may be blocked to stabilize an operation characteristic of the first transistor M1.

The second transistor M2 may be connected between the data line DL and the first node N1. A gate electrode of the second transistor M2 may be connected to the scan line SL. The second transistor M2 may be turned on in case that a first scan signal of a gate-on voltage (for example, a logic high voltage or a high level voltage) is supplied from the scan line SL, to connect the data line DL and the first node N1.

In each frame period, the data signal of a corresponding frame may be supplied to the data line DL, and the data signal may be transmitted to the first node through the second transistor M2 during a period in which the first scan signal of the gate-on voltage may be supplied. For example, the second transistor M2 may be a switching transistor for transmitting each data signal to an inside of the pixel PXL.

A first electrode of the capacitor Cst may be connected to the first node N1, and a second electrode of the capacitor Cst may be connected to the second node N2. The capacitor Cst may charge a voltage corresponding to the data signal supplied to the first node N1 during each frame period.

The third transistor M3 may be connected between the second node N2 and the sensing line SENL. A gate electrode of the third transistor M3 may be connected to the control line SSL (or the scan line SL). The third transistor M3 may be turned on in case that a second scan signal (or a first scan signal) of a gate-on voltage (for example, a logic high voltage or a high level voltage) is supplied from the control line SSL, to transmit the reference voltage (or the initialization voltage) supplied to the sensing line SENL to the second node N2 or transmit a voltage of the second node N2 to the sensing line SENL. The voltage of the second node N2 may be transmitted to the sensing circuit through the sensing line SENL and may be provided to the driving circuit (for example, the timing controller) to be used in compensation or the like of a characteristic deviation of the pixels PXL.

In FIGS. 13 and 14, all of the transistors M included in the pixel circuit PXC may be N-type transistors, but the disclosure is not limited thereto. For example, at least one of the first, second, and third transistors M1, M2, and M3 may be changed to a P-type transistor. The structure and driving method of the pixel PXL may be variously changed according to an embodiment.

The light emitting unit EMU may include at least one light emitting element LD. The light emitting unit EMU may further include at least one pair of electrodes connected to the light emitting element LD. For example, the light emitting unit EMU may include the first pixel electrode ELT1 electrically connected to a first power source which supplies the first power VDD through the pixel circuit PXC and/or the first power line PL1, a second pixel electrode ELT2 electrically connected to a second power source which supplies second power VSS through the second power line PL2, and at least one light emitting element LD electrically connected between the first pixel electrode ELT1 and the second pixel electrode ELT2.

The first power VDD and the second power VSS may have different potentials. For example, the first power VDD may be a high potential pixel power, and the second power VSS may be a low potential pixel power. A potential difference between the first power VDD and the second power VSS may be equal to or greater than a threshold voltage of the light emitting elements LD.

In an embodiment, the light emitting unit EMU may include multiple light emitting elements LD connected in parallel in a forward direction between the first pixel electrode ELT1 and the second pixel electrode ELT2 as in the embodiment of FIG. 13. For example, the first ends EP1 of the light emitting elements LD may be connected to the first pixel electrode ELT1, and the second ends EP2 of the light emitting elements LD may be connected to the second pixel electrode ELT2. In another embodiment, the light emitting unit EMU may include multiple light emitting elements LD connected only in series between the first pixel electrode ELT1 and the second pixel electrode ELT2 or may include only a single light emitting element LD connected in the forward direction between the first pixel electrode ELT1 and the second pixel electrode ELT2.

In still another embodiment, the light emitting unit EMU may include multiple light emitting elements LD connected in series-parallel between the first pixel electrode ELT1 and the second pixel electrode ELT2 as in the embodiment of FIG. 14. In case that the light emitting unit EMU includes multiple light emitting elements LD arranged in at least two series stages, the light emitting unit EMU may further include a third pixel electrode ELT3 (also referred to as an "intermediate electrode IET") connected between the first pixel electrode ELT1 and the second pixel electrode ELT2. For example, the light emitting unit EMU may include the first pixel electrode ELT1, the third pixel electrode ELT3, and the second pixel electrode ELT2 sequentially connected between the pixel circuit PXC and the second power line PL2. The light emitting unit EMU may include multiple light emitting elements LD including at least one first light emitting element LD1 (for example, multiple first light emitting elements LD1) connected in the forward direction between the first pixel electrode ELT1 and the third pixel electrode ELT3, and at least one second light emitting element LD2 (for example, multiple second light emitting elements LD2) connected in the forward direction between the third pixel electrode ELT3 and the second pixel electrode ELT2. For example, the first ends EP1 and the second ends EP2 of the first light emitting elements LD1 may be electrically connected to the first pixel electrode ELT1 and the third pixel electrode ELT3, respectively, and the first ends EP1 and the second ends EP2 of the second light emitting elements LD2 may be electrically connected to the third pixel electrode ELT3 and the second pixel electrode ELT2, respectively.

Each light emitting element LD may configure each effective light source. The effective light sources may be collected to configure a light source of the pixel PXL.

The light emitting elements LD may emit light with a luminance corresponding to the driving current supplied through the pixel circuit PXC. During each frame period, the pixel circuit PXC may supply the driving current corresponding to the data signal to the light emitting unit EMU. The driving current supplied to the light emitting unit EMU may be divided and may flow through the light emitting elements LD. Accordingly, each light emitting element LD may emit light with a luminance corresponding to the current flowing therethrough, and thus the light emitting unit EMU may emit light with the luminance corresponding to the driving current.

FIGS. 13 and 14 show only the light emitting elements LD (for example, effective light sources) connected in the forward direction between the first pixel electrode ELT1 and the second pixel electrode ELT2, but the disclosure is not limited thereto. For example, the light emitting unit EMU may further include at least one ineffective light source in addition to the light emitting elements LD configuring each effective light source. For example, the light emitting unit EMU may further include at least one ineffective light emitting element arranged in a reverse direction between the first pixel electrode ELT1 and the second pixel electrode ELT2 or having at least one floating end.

Figure 15:
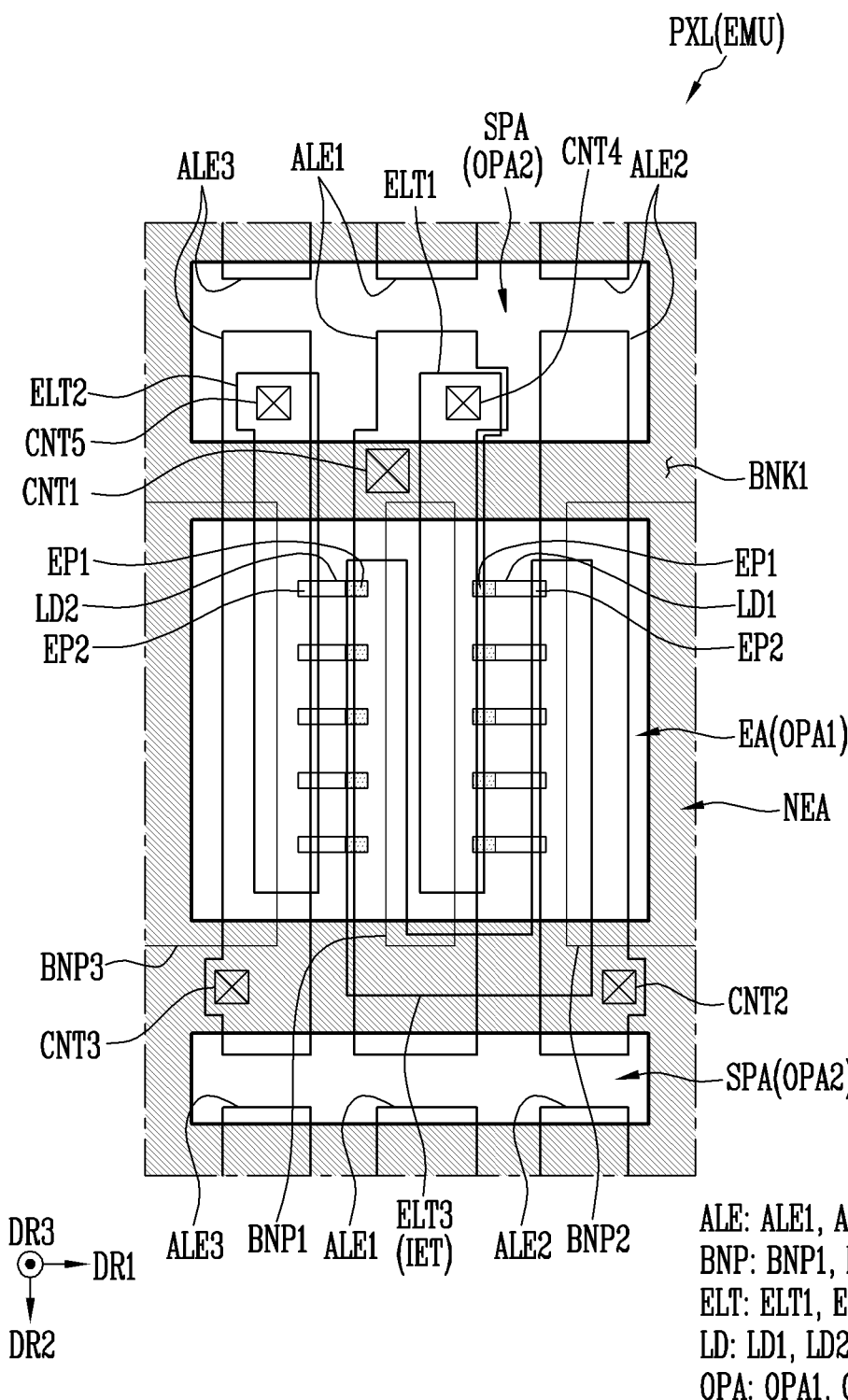
FIG. 15 is a schematic plan view illustrating a pixel according to an embodiment of the disclosure.

FIG. 15 is a schematic plan view illustrating a pixel PXL according to an embodiment of the disclosure. For example, FIG. 15 illustrates a structure of the pixel PXL based on the light emitting unit EMU, and illustrates an embodiment of the light emitting unit EMU including the light emitting elements LD connected in series-parallel between the first pixel electrode ELT1 and the second pixel electrode ELT2 as in the embodiment of FIG. 14.

Referring to FIGS. 1 to 15, the pixel PXL may include an emission area EA in which at least one light emitting element LD may be disposed. In an embodiment, the emission area EA may include light emitting elements LD and electrodes electrically connected to the light emitting elements LD. In an embodiment, the electrodes may include alignment electrodes ALE and pixel electrodes ELT (also referred to as "contact electrodes"). The pixel PXL may further include bank patterns BNP disposed under the alignment electrodes ALE.

The alignment electrodes ALE may have various shapes and may be spaced apart from each other. In an embodiment, the alignment electrodes ALE may be spaced apart from each other along the first direction DR1, and each of the alignment electrodes ALE may have a shape (for example, a bar shape) extending along the second direction DR2.

The shape, size, number, position, and/or mutual disposition structure of the alignment electrodes ALE may be variously changed according to an embodiment. The alignment electrodes ALE may have shapes and/or sizes similar to or the same as each other, or may have different shapes and sizes.

The alignment electrodes ALE may include at least two electrodes spaced apart from each other. For example, the alignment electrodes ALE may include a first alignment electrode ALE1 and a second alignment electrode ALE2, and may selectively further include a third alignment electrode ALE3.

In an embodiment, the first alignment electrode ALE1 may be positioned at a center of the emission area EA, and the second alignment electrode ALE2 and the third alignment electrode ALE3 may be disposed on both sides of the first alignment electrode ALE1. For example, the second alignment electrode ALE2 may be disposed on a right side of the first alignment electrode ALE1, and the third alignment electrode ALE3 may be disposed on a left side of the first alignment electrode ALE1.

The alignment electrodes ALE (or alignment lines before being separated into the alignment electrodes ALE of each of the pixels PXL) may receive alignment signals required for alignment of the light emitting elements LD in an alignment step of the light emitting elements LD. Accordingly, an electric field may be formed between the alignment electrodes ALE, and thus the light emitting elements LD may be aligned and/or arranged between the alignment electrodes ALE. Here, a case where the light emitting elements LD may be aligned and/or arranged between the alignment electrodes ALE may mean that at least a portion of each of the light emitting elements LD may be disposed between the alignment electrodes ALE.

For example, the first alignment electrode ALE1, the second alignment electrode ALE2, and the third alignment electrode ALE3 (or a first alignment line of a state in which the first alignment electrodes ALE1 of the pixels PXL may be connected, a second alignment line of a state in which the second alignment electrodes ALE2 of the pixels PXL may be connected, and a third alignment line of a state in which the third alignment electrodes ALE3 of the pixels PXL may be connected) may receive a first alignment signal, a second alignment signal, and a third alignment signal, respectively, in the alignment step of the light emitting elements LD. The first alignment signal and the second alignment signal may have different waveforms, potentials and/or phases. Accordingly, an electric field may be formed between the first alignment electrode ALE1 and the second alignment electrode ALE2, and thus the light emitting elements LD (for example, the first light emitting elements LD1) may be aligned between the first alignment electrode ALE1 and the second alignment electrode ALE2. The first alignment signal and the third alignment signal may have different waveforms, potentials and/or phases. Accordingly, an electric field may be formed between the first alignment electrode ALE1 and the third alignment electrode ALE3, and thus the light emitting elements LD (for example, the second light emitting elements LD2) may be aligned between the first alignment electrode ALE1 and the third alignment electrode ALE3. The third alignment signal may be the same as or different from the second alignment signal.

The alignment electrodes ALE may be disposed in the emission area EA of each pixel PXL. In an embodiment, the alignment electrodes ALE may extend to a separation area SPA through a non-emission area NEA around the emission area EA. The separation area SPA may be an area where each alignment line (for example, the first alignment line, the second alignment line, or the third alignment line) may be separated into the alignment electrodes ALE of the pixels PXL (for example, the first alignment electrodes ALE1, the second alignment electrodes ALE2, or the third alignment electrodes ALE3 of the pixels PXL) after the alignment of the light emitting elements LD may be completed, and may be disposed on at least one side of each emission area EA.

For example, each pixel PXL may include at least one separation area SPA (for example, two separation areas SPA disposed above and below each emission area EA) disposed around the emission area EA. An end of at least one electrode configuring the light emitting unit EMU (for example, ends of the alignment electrodes ALE) may be disposed in each separation area SPA.

In an embodiment, each alignment electrode ALE may have a separated pattern for each pixel PXL. For example, each of the first, second, and third alignment electrodes ALE1, ALE2, and ALE3 of each of the pixels PXL may have an individually separated pattern.

However, the disclosure is not limited thereto. For example, in a structure in which the second pixel electrodes ELT2 of the pixels PXL may be commonly connected to the second power line PL2, the alignment electrodes ALE (for example, the third alignment electrodes ALE3 of the pixels PXL) connected to the second pixel electrodes ELT2 may not be connected between the pixels PXL adjacent to each other along the first direction DR1 and/or the second direction DR2 and may be integrally formed with each other.

In an embodiment, the first alignment electrode ALE1 may be connected to the pixel circuit PXC (for example, the pixel circuit PXC of the corresponding pixel PXL) and/or the first power line PL1 positioned in a circuit layer PCL (for example, the circuit layer PCL of FIGS. 16 to 18) through a first contact portion CNT1. The first alignment signal may be supplied to the first alignment electrode ALE1 (or the first alignment line) through at least one line (for example, the first power line PL1) positioned in the circuit layer.

The first contact portion CNT1 may include at least one contact hole and/or a via hole. In an embodiment, the first contact portion CNT1 may be positioned in the non-emission area NEA positioned around each emission area EA, but a position of the first contact portion CNT1 may be changed. For example, the first contact portion CNT1 may be disposed in each emission area EA or separation area SPA.

In an embodiment, the second alignment electrode ALE2 may be connected to the second power line PL2 positioned in the circuit layer through a second contact portion CNT2. The second alignment signal may be supplied to the second alignment electrode ALE2 (or the second alignment line) through the second power line PL2.

Similarly, the third alignment electrode ALE3 may be connected to the second power line PL2 positioned in the circuit layer through a third contact portion CNT3. The second alignment signal may also be supplied to the third alignment electrode ALE3 (or the third alignment line) through the second power line PL2.

Each of the second contact portion CNT2 and the third contact portion CNT3 may include at least one contact hole and/or a via hole. In an embodiment, the second contact portion CNT2 and the third contact portion CNT3 may be positioned in the non-emission area NEA positioned around the emission area EA, but positions of the second contact portion CNT2 and the third contact portion CNT3 may be changed. For example, the second contact portion CNT2 and the third contact portion CNT3 may be disposed in each emission area EA or separation area SPA.

At least one first light emitting element LD1 may be arranged between the first alignment electrode ALE1 and the second alignment electrode ALE2. For example, multiple first light emitting elements LD1 may be arranged between the first alignment electrode ALE1 and the second alignment electrode ALE2.

Each of the first light emitting elements LD1 may or may not overlap the first alignment electrode ALE1 and/or the second alignment electrode ALE2. The first end EP1 of the first light emitting element LD1 may be disposed adjacent to the first alignment electrode ALE1, and the second end EP2 of the first light emitting element LD1 may be disposed adjacent to the second alignment electrode ALE2.

The first end EP1 of the first light emitting element LD1 may be electrically connected to the first pixel electrode ELT1. In an embodiment, the first end EP1 of the first light emitting element LD1 may be connected to the first alignment electrode ALE1 through the first pixel electrode ELT1, and may be electrically connected to the pixel circuit PXC and/or the first power line PL1 through the first alignment electrode ALE1.

The second end EP2 of the first light emitting element LD1 may be electrically connected to the third pixel electrode ELT3 and/or the second pixel electrode ELT2. In an embodiment, the second end EP2 of the first light emitting element LD1 may be electrically connected to the third pixel electrode ELT3. The second end EP2 of the first light emitting element LD1 may be electrically connected to the second power line PL2 via the third pixel electrode ELT3, at least one second light emitting element LD2, the second pixel electrode ELT2, and the third alignment electrode ALE3 sequentially.

At least one second light emitting element LD2 may be arranged between the first alignment electrode ALE1 and the third alignment electrode ALE3. For example, multiple second light emitting elements LD2 may be arranged between the first alignment electrode ALE1 and the third alignment electrode ALE3.

Each of the second light emitting elements LD2 may or may not overlap the first alignment electrode ALE1 and/or the third alignment electrode ALE3. The first end EP1 of the second light emitting element LD2 may be disposed adjacent to the first alignment electrode ALE1, and the second end EP2 of the second light emitting element LD2 may be disposed adjacent to the third alignment electrode ALE3.

The first end EP1 of the second light emitting element LD2 may be electrically connected to the third pixel electrode ELT3. The second end EP2 of the second light emitting element LD2 may be electrically connected to the second pixel electrode ELT2. In an embodiment, the second end EP2 of the second light emitting element LD2 may be connected to the third alignment electrode ALE3 through the second pixel electrode ELT2, and may be electrically connected to the second power line PL2 through the third alignment electrode ALE3.

In an embodiment, each light emitting element LD may be an inorganic light emitting element of an ultra-small size (for example, having a small size of a range of nanometer to micrometer) using a material of an inorganic crystalline structure. For example, each light emitting element LD may be an ultra-small inorganic light emitting element manufactured in a rod shape as in the embodiment of FIGS. 1 and 2 by growing a nitride-based semiconductor. However, the type, size, shape, structure, number, and/or the like of the light emitting elements LD configuring each light emitting unit EMU may be changed.

The light emitting elements LD may be prepared in a dispersed form in a solution, and may be supplied to each emission area EA by an inkjet method or a slit coating method. In case that the alignment signals are applied to the alignment electrodes ALE (or the alignment lines) of the pixels PXL simultaneously or after supply of the light emitting elements LD, an electric field is formed between the alignment electrodes ALE, and thus the light emitting elements LD may be aligned. After the light emitting elements LD may be aligned, a solvent may be removed through a drying process or the like.

The first pixel electrode ELT1 may be disposed on the first ends EP1 of the first light emitting elements LD1, and may be electrically connected to the first ends EP1 of the first light emitting elements LD1. For example, the first pixel electrode ELT1 may be directly disposed on the first ends EP1 of the first light emitting elements LD1 to be in contact with the first ends EP1 of the first light emitting elements LD1.

In an embodiment, the first pixel electrode ELT1 may overlap the first alignment electrode ALE1 and may be electrically connected to the first alignment electrode ALE1 through a fourth contact portion CNT4. The first pixel electrode ELT1 may be electrically connected to the pixel circuit PXC and/or the first power line PL1 through the first alignment electrode ALE1. In another embodiment, the first pixel electrode ELT1 may be electrically connected to the pixel circuit PXC and/or the first power line PL1 without passing through the first alignment electrode ALE1.

The third pixel electrode ELT3 may be disposed on the second ends EP2 of the first light emitting elements LD1 and the first ends EP1 of the second light emitting elements LD2, and may be electrically connected to the second ends EP2 of the first light emitting elements LD1 and the first ends EP1 of the second light emitting elements LD2. For example, the third pixel electrode ELT3 may be directly disposed on the second ends EP2 of the first light emitting elements LD1 and the first ends EP1 of the second light emitting elements LD2 to be in contact with the second ends EP2 of the first light emitting elements LD1 and the first ends EP1 of the second light emitting elements LD2. In an embodiment, the third pixel electrode ELT3 may overlap a portion of each of the first and second alignment electrodes ALE1 and ALE2, but is not limited thereto.

The second pixel electrode ELT2 may be disposed on the second ends EP2 of the second light emitting elements LD2 and may be electrically connected to the second ends EP2 of the second light emitting elements LD2. For example, the second pixel electrode ELT2 may be directly disposed on the second ends EP2 of the second light emitting elements LD2 to be in contact with the second ends EP2 of the second light emitting elements LD2.

In an embodiment, the second pixel electrode ELT2 may overlap the third alignment electrode ALE3, and may be electrically connected to the third alignment electrode ALE3 through a fifth contact portion CNT5. The second pixel electrode ELT2 may be electrically connected to the second power line PL2 through the third alignment electrode ALE3. In another embodiment, the second pixel electrode ELT2 may be electrically connected to the second power line PL2 without passing through the third alignment electrode ALE3.

The pixel electrodes ELT (for example, the first pixel electrode ELT1, the second pixel electrode ELT2, and the third pixel electrode ELT3) may be formed in each emission area EA. In an embodiment, at least one pixel electrode ELT may extend from each emission area EA to the non-emission area NEA and/or the separation area SPA. For example, the first and second pixel electrodes ELT1 and ELT2 may extend from each emission area EA to the non-emission area NEA and the separation area SPA, and may be electrically connected to each of the first and third alignment electrodes ALE1 and ALE3 in the separation area SPA. The third pixel electrode ELT3 may be formed only in each emission area EA, or a portion of the third pixel electrode ELT3 may be positioned in the non-emission area NEA. The position, size, shape, mutual disposition structure of the pixel electrodes ELT, the positions of the fourth and fifth contact portions CNT4 and CNT5, and/or the like may be variously changed according to an embodiment.

The bank patterns BNP (also referred to as "patterns" or "wall patterns") may be disposed under the alignment electrodes ALE to overlap a portion of the alignment electrodes ALE. For example, the bank patterns BNP may include a first bank pattern BNP1, a second bank pattern BNP2, and a third bank pattern BNP3 partially overlapping the first alignment electrode ALE1, the second alignment electrode ALE2, and the third alignment electrode ALE3, respectively. In an embodiment, at least one bank pattern BNP may extend to the non-emission area NEA around the emission area EA, but is not limited thereto.

In an embodiment, at least two adjacent pixels PXL may share at least one bank pattern BNP. For example, the second bank pattern BNP2 may be integrally formed with the third bank pattern BNP3 of the pixel PXL adjacent in the first direction DR1 (for example, a pixel adjacent to a right side). Similarly, the third bank pattern BNP3 may be integrally formed with the second bank pattern BNP2 of another pixel adjacent in the first direction DR1 (for example, a pixel adjacent to a left side). The position, structure, number, shape, and/or the like of the bank patterns BNP may be variously changed according to an embodiment.

The non-emission area NEA may be disposed around each emission area EA and/or each separation area SPA. The first bank BNK1 may be disposed in the non-emission area NEA.

The first bank BNK1 may include a first opening OPA1 corresponding to each emission area EA, and may surround the emission area EA. The first bank BNK1 may include second openings OPA2 corresponding to the separation areas SPA and surround the separation areas SPA. For example, the first bank BNK1 may include multiple openings OPA corresponding to each emission area EA and each separation area SPA.

The first bank BNK1 may include at least one light blocking and/or reflective material. For example, the first bank BNK1 may include at least one black matrix material, color filter material of a specific color, and/or the like. Accordingly, light leakage between adjacent pixels PXL may be prevented.

The first bank BNK1 may define each emission area EA to which the light emitting elements LD are to be supplied in the step of supplying the light emitting elements LD to each pixel PXL. For example, as the emission areas EA of the pixels PXL may be separated and partitioned by the first bank BNK1, a desired type and/or amount of a light emitting element mixed liquid may be supplied.

In an embodiment, the first bank BNK1 may include a hydrophobic surface. For example, the first bank BNK1 may be formed to have the hydrophobic surface by forming the first bank BNK1 itself in a hydrophobic pattern using a hydrophobic material or by forming a hydrophobic film formed of a hydrophobic material on the first bank BNK1. For example, the first bank BNK1 may be formed using a hydrophobic organic insulating material having a large contact angle, such as polyacrylate, and thus the first bank BNK1 may be formed in a hydrophobic pattern. Accordingly, the light emitting element mixed liquid may stably flow into the emission area EA.

Figure 16:
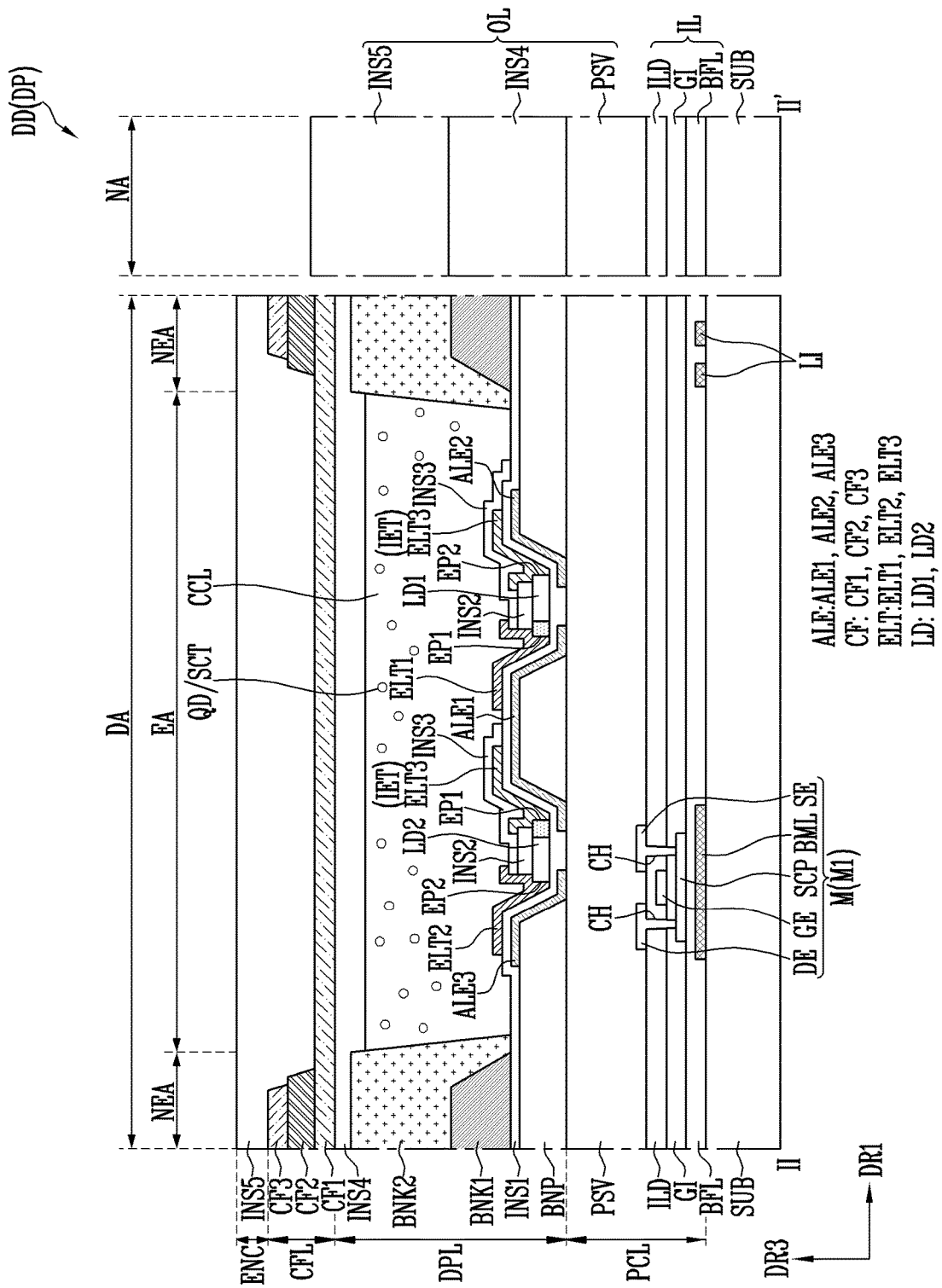
FIGS. 16 to 18 are schematic cross-sectional views illustrating a display device according to an embodiment of the disclosure.
Figure 17:
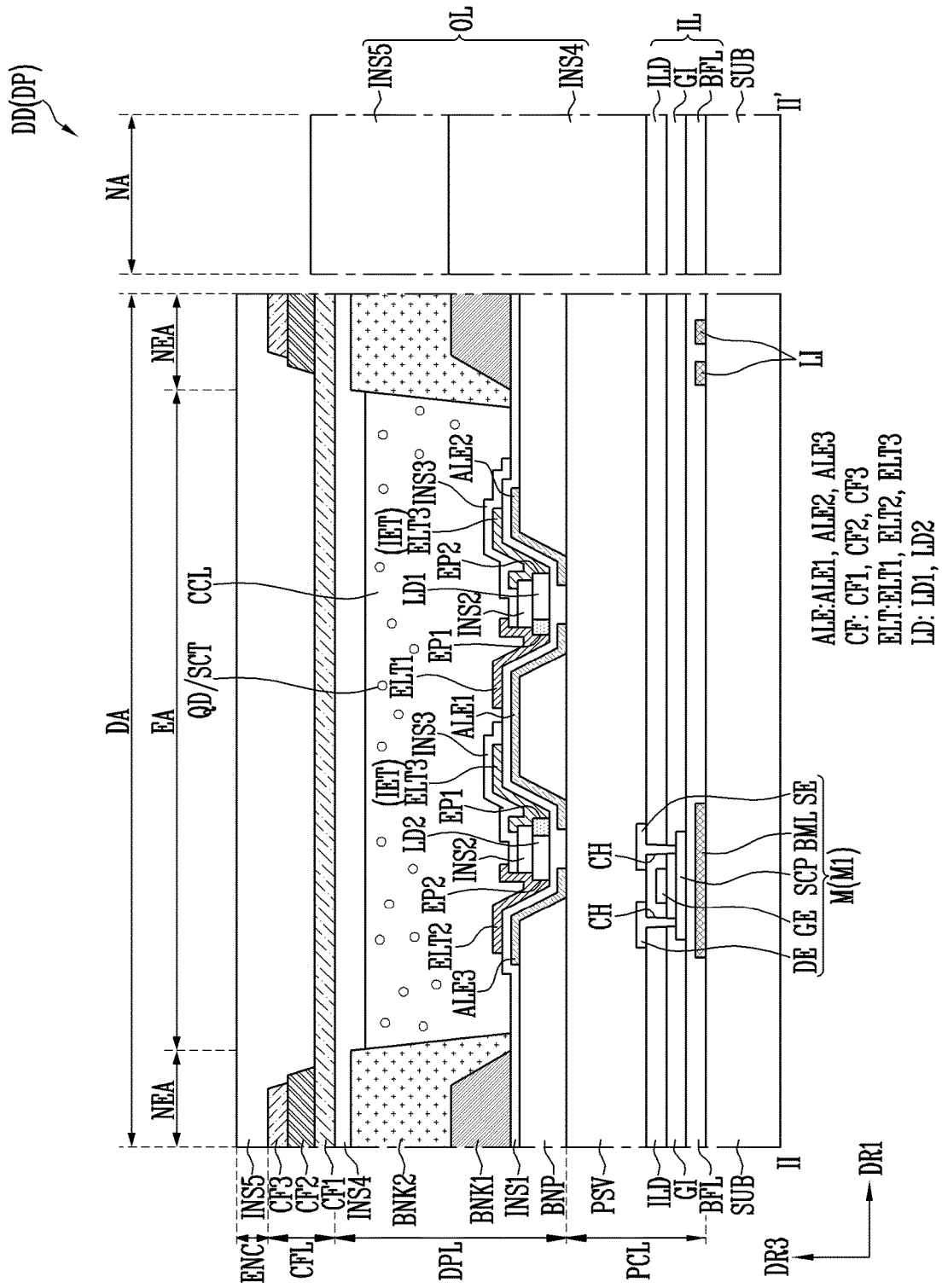
Figure 18:
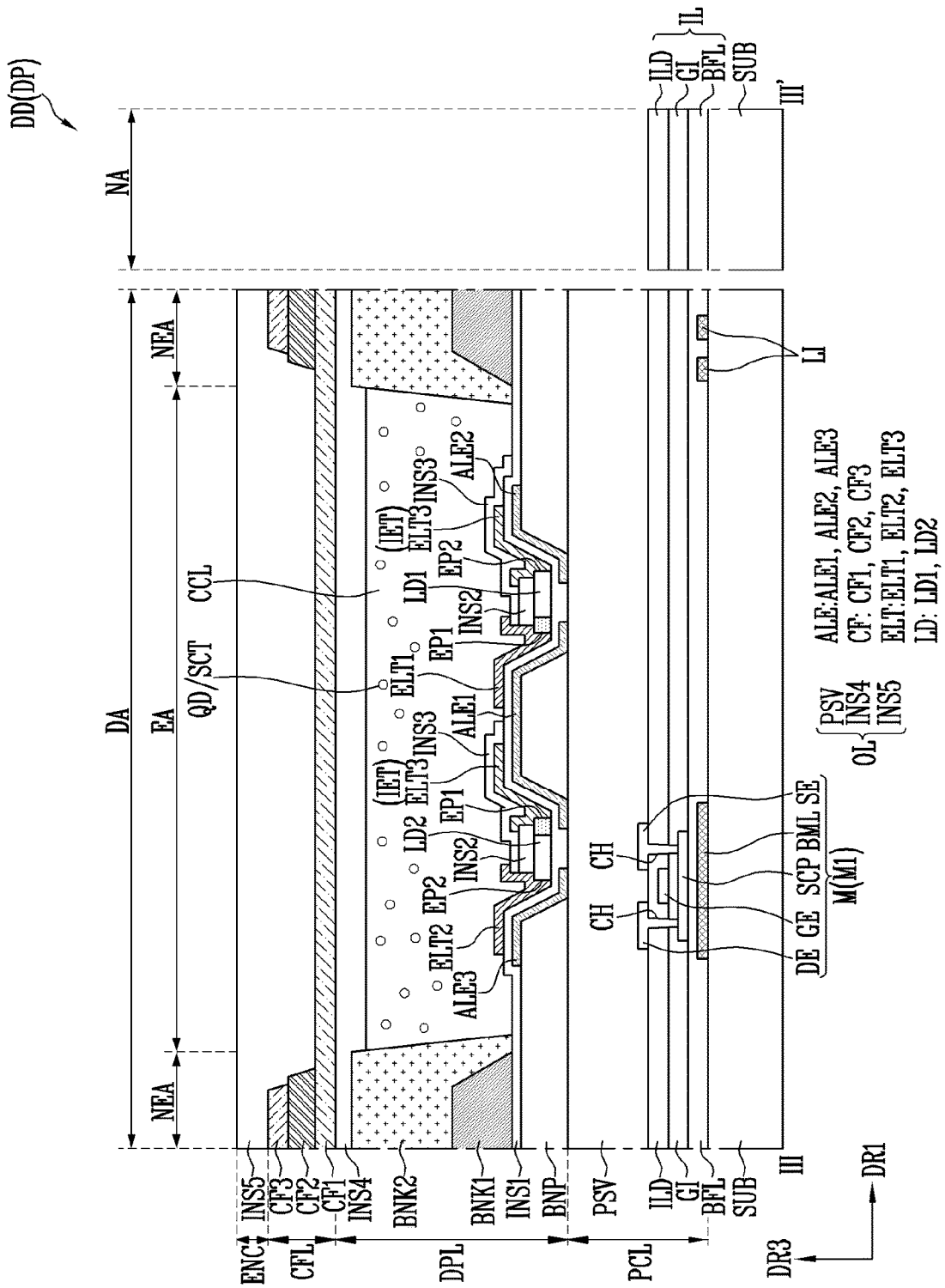

FIGS. 16 to 18 are schematic cross-sectional views illustrating a display device DD according to an embodiment of the disclosure. For example, FIGS. 16 and 17 illustrate embodiments of a cross-section of the display device DD corresponding to a line II~II' of FIG. 10, and illustrate different embodiments in relation to the organic insulating layer OL disposed in a portion of the non-display area NA. FIG. 18 illustrates an embodiment of a cross-section of the display device DD corresponding to a line III~III' of FIG. 10, and illustrates, for example, a cross-section of the organic layer-free area OFA.

Referring to FIGS. 1 to 18, the display device DD may include the substrate SUB, the circuit layer PCL, and a display layer DPL. The circuit layer PCL and the display layer DPL may be provided to overlap each other on the substrate SUB. For example, the circuit layer PCL and the display layer DPL may be sequentially disposed on one surface of the substrate SUB.

The display device DD may further include a color filter layer CFL and/or an encapsulation layer ENC (or a protective layer) disposed on the display layer DPL. In an embodiment, the color filter layer CFL and/or the encapsulation layer ENC may be directly formed on a surface of the substrate SUB on which the circuit layer PCL and the display layer DPL may be formed, but the disclosure is not limited thereto.

The substrate SUB may be a rigid or flexible substrate (or film), and the material or structure thereof is not particularly limited. For example, the substrate SUB may include at least one transparent or opaque insulating material, and may have a structure of a single layer or multiple layers.

The circuit layer PCL may be provided on one surface of the substrate SUB. The circuit layer PCL may include circuit elements configuring the pixel circuit PXC of each pixel PXL. For example multiple circuit elements (for example, transistors M and capacitor Cst configuring each pixel circuit PXC) may be formed in each pixel area of the circuit layer PCL.

In FIGS. 16 to 18, as an example of the circuit elements that may be disposed in the circuit layer PCL, any one transistor M (for example, the first transistor M1 including a bottom metal layer BML) provided in each pixel circuit PXC is illustrated.

The circuit layer PCL may include various signal lines and power lines connected to the pixels PXL. For example, the circuit layer PCL may include scan lines SL, data lines DL, sensing lines SENL, and first and second power lines PL1 and PL2 connected to the pixels PXL. In FIGS. 16 to 18, as an example of lines that may be disposed in the circuit layer PCL, lines LI positioned on the same layer (for example, a first conductive layer) as the bottom metal layer BML is illustrated. Each line LI may be any one of the signal lines and the power lines connected to the pixels PXL. In an embodiment, at least one signal line and/or power line may be disposed on another layer of the circuit layer PCL.

The circuit layer PCL may include multiple insulating layers. For example, the circuit layer PCL may include a buffer layer BFL, a gate insulating layer GI, an interlayer insulating layer ILD, and/or a passivation layer PSV sequentially disposed on a surface of the substrate SUB. In an embodiment, each of the buffer layer BFL, the gate insulating layer GI, and the interlayer insulating layer ILD may include at least one inorganic insulating layer IL, and the passivation layer PSV may include at least one organic insulating layer OL.

The circuit layer PCL may include a first conductive layer disposed on the substrate SUB and including the lower metal layer BML of the first transistor M1. For example, the first conductive layer may be disposed between the substrate SUB and the buffer layer BFL and include the bottom metal layer BML of the first transistor M1 provided in each pixel circuit PXC. The bottom metal layer BML of the first transistor M1 may overlap a gate electrode GE and a semiconductor pattern SCP of the first transistor M1.

The first conductive layer may further include at least one line. For example, the first conductive layer may include at least some of lines extending in the second direction DR2 in the display area DA. For example, the first conductive layer may include the sensing lines SENL, the data lines DL, the first power line PL1 (or a second direction first sub power line), and/or the second power line PL2 (or a second direction second sub power line).

The buffer layer BFL may be disposed on a surface of the substrate SUB including the first conductive layer. The buffer layer BFL may prevent an impurity from diffusing into each circuit element.

A semiconductor layer may be disposed on the buffer layer BFL. The semiconductor layer may include the semiconductor pattern SCP of each transistor M. The semiconductor pattern SCP may include a channel region overlapping the gate electrode GE of the corresponding transistor M, and first and second conductive regions (for example, source and drain regions) disposed on both sides of the channel region. The semiconductor pattern SCP may be a semiconductor pattern formed of polysilicon, amorphous silicon, an oxide semiconductor, or the like, or a combination thereof.

The gate insulating layer GI may be disposed on the semiconductor layer. A second conductive layer may be disposed on the gate insulating layer GI.

The second conductive layer may include the gate electrode GE of each transistor M. The second conductive layer may further include one electrode of the capacitor Cst, a bridge pattern, and/or the like provided in the pixel circuit PXC. In case that at least one power line and/or signal line disposed in the display area DA is configured of multiple layers, the second conductive layer may further include at least one conductive pattern configuring the at least one power line and/or signal line.

The interlayer insulating layer ILD may be disposed on the second conductive layer. A third conductive layer may be disposed on the interlayer insulating layer ILD.

The third conductive layer may include a source electrode SE and a drain electrode DE of each transistor M. The source electrode SE may be connected to one region (for example, the source region) of the semiconductor pattern SCP included in the corresponding transistor M through at least one contact hole CH, and the drain electrode DE may be connected to another region (for example, the drain region) of the semiconductor pattern SCP included in the corresponding transistor M through at least one other contact hole CH. The third conductive layer may further include another electrode of the capacitor Cst, lines, a bridge pattern, and/or the like provided in the pixel circuit PXC. For example, the third conductive layer may include at least some of lines extending in the first direction DR1 in the display area DA. For example, the third conductive layer may include the scan lines SL, the control lines SSL, the first power line PL1 (or a first direction first sub power line), and/or the second power line PL2 (or a first direction second sub power line) connected to the pixels PXL. In case that at least one power line and/or signal line disposed in the display area DA is configured of multiple layers, the third conductive layer may further include at least one conductive pattern configuring the at least one power line and/or signal line.

Each conductive pattern, electrode and/or line configuring the first to third conductive layers may have conductivity by including at least one conductive material, and a configuration material thereof is not particularly limited. For example, each conductive pattern, electrode and/or line configuring the first to third conductive layers may include at least one metal selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), titanium (Ti), tantalum (Ta), tungsten (W), and copper (Cu), and may include various types of conductive materials.

The passivation layer PSV (also referred to as a "first organic insulating layer") may be disposed on the third conductive layer. Each of the buffer layer BFL, the gate insulating layer GI, the interlayer insulating layer ILD, and the passivation layer PSV may be configured as a single layer or multiple layers, and may include at least one inorganic insulating material and/or organic insulating material. In an embodiment, each of the buffer layer BFL, the gate insulating layer GI, and the interlayer insulating layer ILD may include various types of inorganic insulating materials including silicon nitride ($SiN_x$), silicon oxide ($SiO_x$), silicon oxynitride ($SiO_xN_y$), or the like, or a combination thereof. In an embodiment, the passivation layer PSV may include at least one organic insulating layer OL including at least one organic insulating material. In an embodiment, the passivation layer PSV may be entirely disposed in at least the display area DA, and may planarize a surface of the circuit layer PCL.

The display layer DPL may be disposed on the passivation layer PSV.

The display layer DPL may include the light emitting unit EMU of each pixel PXL. For example, the display layer DPL may include the alignment electrodes ALE, at least one light emitting element LD, and the pixel electrodes ELT disposed in the emission area EA of each pixel PXL. In an embodiment, each light emitting unit EMU may include light emitting elements LD as in the embodiments of FIGS. 13 to 15.

The display layer DPL may further include insulating patterns and/or insulating layers sequentially disposed on one surface of the substrate SUB on which the circuit layer PCL may be formed. For example, the display layer DPL may include the bank patterns BNP, a first insulating layer INS1, the first bank BNK1, a second insulating layer INS2 (also referred to as an "anchor pattern" or a "insulating pattern"), a third insulating layer INS3, a second bank BNK2, and/or a fourth insulating layer INS4. The display layer DPL may selectively further include a light conversion layer CCL.

In FIGS. 16 to 18, as an example of the light emitting unit EMU that may be disposed in the display layer DPL, a cross-section of the light emitting unit EMU along the first direction DR1 according to the embodiment of FIG. 15 is shown.

The bank patterns BNP may be provided and/or formed on the passivation layer PSV. The bank patterns BNP may be disposed under the alignment electrodes ALE to overlap a portion of each of the alignment electrodes ALE.

The alignment electrodes ALE may protrude in an upper direction (for example, the third direction DR3) around the light emitting elements LD by the bank patterns BNP. The bank patterns BNP and the alignment electrodes ALE thereon may form a reflective protrusion pattern around the light emitting elements LD. Accordingly, light efficiency of the pixel PXL may be improved.

The bank patterns BNP may include an inorganic insulating layer formed of an inorganic material or an organic insulating layer formed of an organic material. The bank patterns BNP may be formed as a single layer or multiple layers. The alignment electrodes ALE may be disposed on the bank patterns BNP.

The alignment electrodes ALE may include at least one conductive material. For example, each alignment electrode ALE may include at least one conductive material among at least one metal among various metal materials including silver (Ag), magnesium (Mg), aluminum (Al), platinum (Pt), palladium (Pd), gold (Au), nickel (Ni), neodymium (Nd), iridium (Ir), chromium (Cr), titanium (Ti), molybdenum (Mo), copper (Cu), and the like, an alloy thereof, a conductive oxide such as indium tin oxide (ITO), indium zinc oxide (IZO), indium tin zinc oxide (ITZO), zinc oxide (ZnO), aluminum doped zinc oxide (AZO), gallium doped zinc oxide (GZO), zinc tin oxide (ZTO), gallium tin oxide (GTO), and fluorine doped tin oxide (FTO), and a conductive polymer such as PEDOT, but is not limited thereto. For example, the alignment electrodes ALE may include other conductive materials such as carbon nano tube or graphene. For example, the alignment electrodes ALE may have conductivity by including at least one of various conductive materials. The first alignment electrodes ALE may include the same or different conductive materials.

Each alignment electrode ALE may be configured as a single layer or multiple layers. For example, each alignment electrode ALE may include a reflective electrode layer including a reflective conductive material (for example, metal), and may be configured as an electrode of a single layer or multiple layers.

The first insulating layer INS1 may be disposed on the alignment electrodes ALE. In an embodiment, the first insulating layer INS1 may include a contact hole for connecting at least one of the alignment electrodes ALE to any one pixel electrode ELT. For example, the first insulating layer INS1 may include contact holes for forming the first to third contact portions CNT1 to CNT3 of FIG. 15.

The first insulating layer INS1 may be configured as a single layer or multiple layers, and may include at least one inorganic insulating material and/or an organic insulating material. In an embodiment, the first insulating layer INS1 may include at least one type of inorganic insulating material including silicon nitride ($SiN_x$), silicon oxide ($SiO_x$), silicon oxynitride ($SiO_xN_y$), or a combination thereof. In an embodiment, the first insulating layer INS1 may be disposed only in the display area DA, but is not limited thereto.

As the alignment electrodes ALE may be covered by the first insulating layer INS1, damage to the alignment electrodes ALE in a subsequent process may be prevented. An occurrence of a short defect due to an improper connection between the alignment electrodes ALE and the light emitting elements LD may be prevented.

The first bank BNK1 may be disposed in the display area DA in which the alignment electrodes ALE and the first insulating layer INS1 may be formed. The first bank BNK1 may be formed in the non-emission area NEA to surround the emission area EA of each pixel PXL.

The light emitting elements LD may be supplied to each emission area EA surrounded by the first bank BNK1. The light emitting elements LD may be aligned between the alignment electrodes ALE by the alignment signals applied to the alignment electrodes ALE (or the alignment lines before being separated into the alignment electrodes ALE of each pixel PXL). For example, in case that it is assumed that the pixel PXL includes the first alignment electrode ALE1 positioned in the center and the second and third alignment electrodes ALE2 and ALE3 positioned on both sides of the first alignment electrode ALE1, at least one first light emitting element LD1 may be aligned between the first alignment electrode ALE1 and the second alignment electrode ALE2, and at least one second light emitting element LD2 may be aligned between the first alignment electrode ALE1 and the third alignment electrode ALE3.

The second insulating layer INS2 may be disposed on a portion of the light emitting elements LD. For example, the second insulating layer INS2 may be disposed locally on a portion including a center portion of the light emitting elements LD to expose the first and second ends EP1 and EP2 of the light emitting elements LD aligned in the emission area EA of the corresponding pixel PXL. In case that the second insulating layer INS2 is formed on the light emitting elements LD, the light emitting elements LD may be stably fixed.

The second insulating layer INS2 may be configured as a single layer or multiple layers, and may include at least one inorganic insulating material and/or organic insulating material. For example, the second insulating layer INS2 may include various types of organic and/or inorganic insulating materials including silicon nitride ($SiN_x$), silicon oxide ($SiO_x$), silicon oxynitride ($SiO_xN_y$), aluminum oxide ($Al_xO_y$), photoresist (PR) material, and the like, or a combination thereof.

On both ends, for example, the first and second ends EP1 and EP2 of the light emitting elements LD, which may not be covered by the second insulating layer INS2, different pixel electrodes ELT may be disposed and/or formed. For example, the first pixel electrode ELT1 may be disposed on the first end EP1 of the first light emitting element LD1, and a portion of the third pixel electrode ELT3 may be disposed on the second end EP2 of the first light emitting element LD1. Another portion of the third pixel electrode ELT3 may be disposed on the first end EP1 of the second light emitting element LD2, and the second pixel electrode ELT2 may be disposed on the second end EP2 of the second light emitting element LD2.

In an embodiment, the first pixel electrode ELT1 may be electrically connected to the first alignment electrode ALE1 through at least one contact portion (for example, the fourth contact portion CNT4 of FIG. 15). Similarly, the second pixel electrode ELT2 may be electrically connected to the third alignment electrode ALE3 through at least one contact portion (for example, the fifth contact portion CNT5 of FIG. 15). The third pixel electrode ELT3 may be electrically connected to the first pixel electrode ELT1 through the first light emitting element LD1, and may be electrically connected to the second pixel electrode ELT2 through the second light emitting element LD2.

In an embodiment, the first alignment electrode ALE1 of each pixel PXL may be electrically connected to the first transistor M1 of the corresponding pixel PXL through at least one contact portion (for example, the first contact portion CNT1 of FIG. 15). Similarly, the second and third alignment electrodes ALE2 and ALE3 may be electrically connected to the second power line PL2 through at least one contact portion (for example, the second contact portion CNT2 and the third contact portion CNT3 of FIG. 15).

The first pixel electrode ELT1 may be disposed on the first alignment electrode ALE1 to overlap a portion of the first alignment electrode ALE1, and the second pixel electrode ELT2 may be disposed on the third alignment electrode ALE3 to overlap a portion of the third alignment electrode ALE3. The third pixel electrode ELT3 may be disposed on the first alignment electrode ALE1 and the second alignment electrode ALE2 to overlap another portion of the first alignment electrode ALE1 and the second alignment electrode ALE2.

In an embodiment, the first pixel electrode ELT1 may be electrically connected to the first end EP1 of the first light emitting element LD1, and the second pixel electrode ELT2 may be electrically connected to the second end EP2 of the second light emitting element LD2. The third pixel electrode ELT3 may be electrically connected to the second end EP2 of the first light emitting element LD1 and the first end EP1 of the second light emitting element LD2.

The first pixel electrode ELT1, the second pixel electrode ELT2, and/or the third pixel electrode ELT3 may be formed on the same or different layers. In an embodiment, the first and second pixel electrodes ELT1 and ELT2 may be formed on the same layer, and the third pixel electrode ELT3 may be formed on a layer different from that of the first and second pixel electrodes ELT1 and ELT2. For example, the first and second pixel electrodes ELT1 and ELT2 and the third pixel electrode ELT3 may be disposed on different layers with the third insulating layer INS3 interposed therebetween. In another embodiment, all of the first to third electrodes ELT1 to ELT3 may be formed on the same layer. The pixel PXL may not include the third insulating layer INS3. A mutual position, a formation order, and/or the like of the pixel electrodes ELT may be variously changed according to an embodiment.

As in the embodiment of FIG. 13, in case that each pixel PXL includes the light emitting unit EMU of a parallel structure, the pixel PXL may not include the third pixel electrode ELT3. The first pixel electrode ELT1 may be disposed on the first ends EP1 of the light emitting elements LD, and the second pixel electrode ELT2 may be disposed on the second ends EP2 of the light emitting elements LD.

The pixel electrodes ELT may include at least one conductive material. In an embodiment, the pixel electrodes ELT may include a transparent conductive material to allow light emitted from the light emitting elements LD to transmit the pixel electrode ELT.

In an embodiment, the display device DD may include a light conversion layer CCL provided on the light emitting unit EMU of each pixel PXL. For example, the light conversion layer CCL may be provided in each emission area EA to be positioned on the light emitting elements LD of each pixel PXL.

The display device DD may further include the second bank BNK2 disposed in the non-emission area NEA to overlap the first bank BNK1. The second bank BNK2 may define (or partition) each emission area EA in which the light conversion layer CCL is to be formed. In an embodiment, the second bank BNK2 may be integrated with the first bank BNK1.

The second bank BNK2 may include a light blocking material including a black matrix material and/or a reflective material. The second bank BNK2 may include a material the same as or different from that of the first bank BNK1.

The light conversion layer CCL may include at least one of wavelength conversion particles (or color conversion particles) for converting a wavelength and/or a color of the light emitted from the light emitting elements LD, and light scattering particles SCT for increasing light output efficiency of the pixel PXL by scattering the light emitted from the light emitting elements LD. For example, each light conversion layer CCL may be provided on each light emitting unit EMU, and the light conversion layer CCL may include wavelength converting particles including at least one type of a quantum dot QD (for example, a red quantum dot, a green quantum dot, and/or a blue quantum dot) and/or light scattering particles SCT.

For example, in case that any one pixel PXL is set as a red (or green) pixel and blue light emitting elements LD are provided in the light emitting unit EMU of the pixel PXL, the light conversion layer CCL including the red (or green) quantum dot QD for converting blue light into red (or green) light may be disposed on the light emitting unit EMU of the pixel PXL. The light conversion layer CCL may further include the light scattering particles SCT.

The fourth insulating layer INS4 (also referred to as a "second organic insulating layer") may be disposed on one surface of the substrate SUB including the light emitting units EMU and/or the light conversion layers CCL of the pixels PXL.

In an embodiment, the fourth insulating layer INS4 may include at least one organic insulating layer OL. The fourth insulating layer INS4 may be entirely disposed in at least the display area DA, and may substantially planarize a surface of the display layer DPL. The fourth insulating layer INS4 may protect the light emitting units EMU and/or the light conversion layers CCL of the pixels PXL.

The color filter layer CFL may be disposed on the fourth insulating layer INS4.

The color filter layer CFL may include color filters CF corresponding to colors of the pixels PXL. For example, the color filter layer CFL may include a first color filter CF1 disposed in the emission area EA of the first color pixel PXL1, a second color filter CF2 disposed in the emission area EA of the second color pixel PXL2, and a third color filter CF3 disposed in the emission area EA of the third color pixel PXL3. Each color filter CF may be provided on the fourth insulating layer INS4 to overlap the light emitting unit EMU of the corresponding pixel PXL.

In an embodiment, the first, second, and third color filters CF1, CF2, and CF3 may be disposed to overlap each other in the non-emission area NEA. In another embodiment, the first, second, and third color filters CF1, CF2, and CF3 may be formed to be separated from each other on the emission areas EA of each pixel PXL, and a separate light blocking pattern may be disposed among the first, second, and third color filters CF1, CF2, and CF3.

The encapsulation layer ENC may be disposed on the color filter layer CFL. The encapsulation layer ENC may include the fifth insulating layer INS5 (also referred to as a "third organic insulating layer"). In an embodiment, the fifth insulating layer INS5 may include at least one organic insulating layer OL including at least one organic insulating material, and may be configured as a single layer or multiple layers. The fifth insulating layer INS5 may be entirely formed in at least the display area DA to cover the circuit layer PCL, the display layer DPL, and/or the color filter layer CFL, and may planarize a surface of the display device DD.

In an embodiment, at least one inorganic insulating layer IL (for example, multiple inorganic insulating layers IL provided in the circuit layer PCL) disposed in the display area DA may also be disposed in the non-display area NA. For example, the buffer layer BFL, the gate insulating layer GI, and/or the interlayer insulating layer ILD may be entirely formed on one surface of the substrate SUB including the display area DA and the non-display area NA.

In an embodiment, at least one organic insulating layer OL (for example, the passivation layer PSV provided in the circuit layer PCL, and/or the fourth insulating layer INS4 and/or the fifth insulating layer INS5 disposed in the display area DA) may be provided on only a portion of the substrate SUB to be disposed in the remaining area except for the organic layer-free area OFA. For example, as in the embodiment of FIG. 9, in case that the entire non-display area NA is set as the organic layer-free area OFA, the passivation layer PSV, the fourth insulating layer INS4, and the fifth insulating layer INS5 may be disposed only in the display area DA and may not be disposed in the non-display area NA. In other embodiments, as in the embodiments of FIGS. 10 to 12, in case that only a portion of the non-display area NA is set as the organic layer-free area OFA, at least one of the passivation layer PSV, the fourth insulating layer INS4, and the fifth insulating layer INS5 may be disposed on a portion of the non-display area NA except for the organic layer-free area OFA.

In an embodiment, as in the embodiment of FIG. 16, the passivation layer PSV may be disposed in a portion of the non-display area NA together with the fourth and fifth insulating layers INS4 and INS5. In another embodiment, as in the embodiment of FIG. 17, the passivation layer PSV may be provided only in the display area DA and only the fourth insulating layer INS4 and/or the fifth insulating layer INS5 may be disposed only in a portion of the non-display area NA.

In an embodiment in which only a portion of the non-display area NA is set as the organic layer-free area OFA, the type, number, and/or the like of the organic layer OL provided in the remaining portion of the non-display area NA except for the organic layer-free area OFA may be variously changed according to an embodiment. For example, at least one of the organic insulating layers OL provided in the display area DA may be selectively disposed in a portion of the non-display area NA. In an embodiment, at least one organic insulating layer OL may have different thicknesses in the display area DA and the non-display area NA. For example, the fourth insulating layer INS4 and/or the fifth insulating layer INS5 may be formed to be thicker in the non-display area NA than in the display area DA. Accordingly, flatness of the display device DD may be improved.

The organic insulating layer OL may not be provided and/or disposed in the organic layer-free area OFA of the non-display area NA. For example, as in the embodiment of FIG. 18, only at least one inorganic insulating layer IL may be disposed in a portion of the non-display area NA corresponding to the organic layer-free area OFA. The type, number, and/or the like of the inorganic insulating layers IL provided in the organic layer-free area OFA may be variously changed according to an embodiment. For example, at least one (for example, the buffer layer BFL, the gate insulating layer GI, and the interlayer insulating layer ILD) of the inorganic insulating layers IL provided in the display area DA may be disposed in the organic layer-free area (OFA).

Although the technical idea of the disclosure has been described in detail in accordance with the above-described embodiments, it should be noted that the above-described embodiments are for the purpose of description and not of limitation. In addition, those skilled in the art may understand that various modifications are possible within the scope of the disclosure.

The scope of the disclosure is not limited to the details described in the detailed description of the specification. In addition, it is to be construed that all changes or modifications derived from the disclosure are to be included in the scope of the disclosure.

What is claimed is:

1. A display device comprising:
   a display area and a non-display area;
   an inorganic insulating layer disposed on a substrate, the inorganic insulating layer disposed in the display area and the non-display area;
   pixels disposed on the substrate and overlapping the inorganic insulating layer in a plan view, the pixels disposed in the display area;
   an organic insulating layer disposed on the substrate and overlapping the inorganic insulating layer and the pixels in a plan view, the organic insulating layer disposed in the display area;
   edge areas disposed in different portions of the non-display area; and
   corner areas where the edge areas meet, wherein
   the non-display area includes an organic layer-free area,
   the organic insulating layer is disposed on the substrate so as to be disposed in an area except for the organic layer-free area,
   the organic layer-free area includes the corner areas,
   the edge areas include a first edge area including a pad area,
   the organic layer-free a rea further includes the first edge area, and
   the organic insulating layer is further disposed in a portion of remaining edge areas of the edge areas except for the first edge area.

2. The display device according to claim 1, wherein the organic insulating layer is disposed in a center area of each of the remaining edge areas except for ends corresponding to the corner areas in each of the remaining edge areas.

3. The display device according to claim 2, wherein the organic insulating layer has a width corresponding to a width of each of the remaining edge areas in the center area of each of the remaining edge areas.

4. The display device according to claim 2, wherein the organic insulating layer has a width less than a width of each of the remaining edge areas in the center area of each of the remaining edge areas.

5. The display device according to claim 2, wherein the non-display area comprises:
   a first non-display area adjacent to the display area and surrounding the display area; and
   a second non-display area adjacent to the first non-display area and surrounding the first non-display area.

6. The display device according to claim 5, wherein the organic insulating layer is disposed in the first non-display area in the center area of each of the remaining edge areas, and the second non-display area includes an outer edge area of the display device and corresponds to the organic layer-free area in a plan view.

7. The display device according to claim 5, wherein the non-display area further includes a third non-display area surrounding the second non-display area and including an outer edge area of the display device.

8. The display device according to claim 7, wherein
   the organic insulating layer is disposed in the first non-display area and the third non-display area in the center area of each of the remaining edge areas, and
   the second non-display area corresponds to the organic layer-free area.

9. The display device according to claim 8, wherein the organic insulating layer disposed in the third non-display area is separated from the organic insulating layer disposed in the display area and the first non-display area.

10. The display device according to claim 1, wherein each of the pixels includes a light emitting unit including at least one light emitting element.

11. The display device according to claim 10, wherein the organic insulating layer comprises:
    a first organic insulating layer between the light emitting unit of each of the pixels and the inorganic insulating layer, the first organic insulating layer being disposed entirely in the display area; and
    a second organic insulating layer disposed on the light emitting unit of each of the pixels, the second organic insulating layer being disposed entirely in the display area.

12. The display device according to claim 11, further comprising:
    a light conversion layer between the light emitting unit of each of the pixels and the second organic insulating layer, the light conversion layer including at least one of wavelength conversion particles or light scattering particles that are disposed in an emission area of each of the pixels; and
    a color filter layer including a color filter disposed on the second organic insulating layer and overlapping the light emitting unit of each of the pixels in a plan view.

13. The display device according to claim 12, wherein the organic insulating layer further includes a third organic insulating layer disposed on the color filter layer, the third organic insulating layer being disposed entirely in the display area.

14. The display device according to claim 10, wherein each of the pixels further includes a pixel circuit including a transistor electrically connected to the light emitting unit.

15. The display device according to claim 14, further comprising:
    a circuit layer disposed with the pixel circuits of the pixels,
    wherein the inorganic insulating layer includes a plurality of inorganic insulating layers disposed on the circuit layer.

16. The display device according to claim 1, wherein
    the display area is disposed in a center area of the display device, and
    the non-display area is disposed in an edge area of the display device and has a width of about 50 micrometers or less.

* * * * *